United States Patent [19]
Uhling et al.

[11] Patent Number: 5,600,278
[45] Date of Patent: Feb. 4, 1997

[54] PROGRAMMABLE INSTRUMENTATION AMPLIFIER

[75] Inventors: Thomas F. Uhling, Monument; Keith C. Griggs, Colorado Springs, both of Colo.

[73] Assignee: Hewlett-Packard Company, Palo Alto, Calif.

[21] Appl. No.: 384,295

[22] Filed: Feb. 3, 1995

[51] Int. Cl.$^6$ .................................. H03F 3/68; H03G 3/30
[52] U.S. Cl. .......................... 330/51; 327/411; 330/254; 330/295
[58] Field of Search ........................... 330/51, 254, 295; 327/407, 411

[56] References Cited

U.S. PATENT DOCUMENTS

| | | | |
|---|---|---|---|
| 3,904,977 | 9/1975 | Barsotti | 330/51 |
| 4,191,856 | 3/1980 | Nagano et al. | 327/411 X |
| 4,430,732 | 2/1984 | Saga et al. | 330/295 X |
| 4,572,967 | 2/1986 | Metz | 327/411 |
| 4,835,771 | 5/1989 | Moussie | 327/411 X |
| 5,032,801 | 7/1991 | Woo et al. | 330/51 X |

FOREIGN PATENT DOCUMENTS

| | | | |
|---|---|---|---|
| 148411 | 8/1984 | Japan | 330/254 |
| 3085804 | 4/1991 | Japan | 330/254 |

OTHER PUBLICATIONS

Graeme, "Digital Gain Control Wins Op Amp a Niche in Microprocessor Systems," *Electronic Design*, Feb. 21, 1985, pp. 205–214.

Schoffer, "Monolithic CMOS Video Mux/Amp Pushes 50 MHz" *Electronic Engineering*, Oct. 1987, pp. 43, 44, 48, 52.

Krylov et al. "Integrated Circuit Analog Switch" *Pribory i Tékhnika Éksperimenta*, No. 4, Jul.–Aug., 1977, pp. 122–123.

DeBurd et al. "Analog Multiplexing Device", *IBM Technical Disclosure Bulletin*, vol. 20, No. 7, Dec., 1977, pp. 2722, 2723.

Primary Examiner—James B. Mullins

[57] ABSTRACT

A first amplifier channel between an input and output includes an input transistor emitter and a first output transistor emitter connected together to form a first emitter pair. A current source is connected to the emitter pair via a transistor which is controlled by a latch. Programming the latch permits the channel to be turned on or off. The emitter pair is connected to a positive voltage through a resistor and to ground through a diode to force it to a controlled off voltage, which prevents signals from passing when the channel is off. There is a output driver amplifier in a feedback circuit. An outdisable circuit controls the voltage and current of the output driver amplifier to place the output in a state in which it appears electrically as an open circuit when the channel is off. Multiple programmable amplifiers can be combined to make a multiplexer, a selectable gain circuit, or a selectable attenuation circuit, all with high band width and high signal integrity.

14 Claims, 11 Drawing Sheets

PROGRAMMABLE INSTRUMENTATION AMPLIFIER

BACKGROUND OF THE INVENTION

1. Field of the Invention

The invention in general relates to electronic probes and other instrumentation amplifier circuits which may be used to pass analog signals over a wide band width of frequencies with little distortion, and more particularly to such an amplifier that is programmable.

2. Statement of the Problem

In the field of instrumentation amplifiers, such as amplifiers for electronic test probes, oscilloscopes, and other instruments, the primary requirement is that amplifiers must handle analog signals with little distortion over a wide band-width of frequencies. Amplifiers that may be used for multiplexing are rare, or non-existent, in the field, since multiplexing is usually thought of as inconsistent with the primary requirement. That is, multiplexing is usually associated with trading off at least some signal fidelity and band width in return for the ability to handle many signals simultaneously or alternatively.

It is well-known that an amplifier may be made by tying together an "emitter pair". Such amplifiers usually are implemented in bipolar technology by connecting the emitters of two bipolar transistors. When the emitter pair is connected to the low or ground voltage through a resistor, often designated as $R_E$, the collectors of the transistors are connected to the high voltage through resistors, the input is provided to the bases of the transistors, and the output is taken from the collectors, the amplifier is known as a differential amplifier. When the resistor $R_E$ is replaced by a third transistor which provides current-source biasing of the first two transistors, the amplifier is known as an operational amplifier or op-amp. It is also well-known to use feedback in such amplifiers by tying the output collector to the input base of the same transistor. The feedback reduces the gain of the amplifier but increases the band width over which low distortion is possible.

While operational amplifiers with feedback are commonly used as amplifiers, it has generally been thought that they do not lend themselves to multiplexing. Multiplexing requires positive switching; that is a circuit that is on must be positively on and a circuit that is off must be positively off, no matter what stray signals are seen on their inputs and outputs. Since the function of operational amplifiers is primarily determined by the biasing provided by the ground and power supply, i.e. the relative voltages applied to the emitters and collectors, stray signals applied through the ground and power supply terminals can alter the on or off state of such amplifiers. Since multiplexing inherently requires many similar adjacent circuits to be connected to the same ground and power supply, feedback op-amps would not appear to be compatible with multiplexing. Further, the very thing that makes feedback op-amps useful for low distortion over a wide bandwidth, the feedback, also tends to make them susceptible to being influenced by stray signals on their outputs. Since it is in the nature of multiplexing that signals from one multiplexing channels show up at the output of adjacent multiplexing channels, feedback op-amps would not seem compatible with multiplexing for this reason also.

For the above reasons the instrumentation art has up to now essentially been limited to single channel systems. When requirements demanded more than one channel, then a number of independent circuits, i.e. a number of single channel systems, were simply placed side by side. This is expensive, since each channel is a separate sophisticated instrumentation amplifier.

As electronic systems have become more and more complex, with ever higher numbers of elements, such as pins on circuit packages, it has become either very time consuming, very expensive, or both to probe state-of-the-art circuit packages with essentially single channel instrumentation. Thus an instrumentation amplifier that provides multiplexing capability with low distortion over a wide band width is highly desirable.

SUMMARY OF THE INVENTION

The invention solves the above problem by providing a programmable operational amplifier with feedback. The emitters of two transistors are connected to form an emitter pair. The input to the amplifier connects to the base of one transistor, which we will refer to herein as the input transistor, while the collector/base connection of the other transistor, which we will refer to herein as the output transistor, provides the feedback and output. An additional transistor in the feedback loop, which we shall refer to herein as the output driver transistor, may drive the amplifier output to provide additional gain.

The programmability is preferably provided by a current source transistor connected between the low power supply and the emitter pair and a latch connected to the base of the current source transistor. This latch/current source transistor biases the emitter pair to turn the amplifier on or off. In addition, the emitter pair is forced to a controlled voltage by a separate biasing circuit when the amplifier is off. The latch may be programmed by many different input devices, though preferably the programming is done via a computer.

The bare amplifier according to the invention provides a programmable ON/OFF channel that may be applied in a variety of ways. Preferably the amplifier and the applications are implemented on integrated circuit chips.

In perhaps the simplest application, the amplifier provides an output stage that may be programmed to be either on or off. Preferably, in this application a programmable outdisable circuit forces the output of the amplifier to a state in which it appears electrically as an open circuit when the amplifier is programmed to be off. The outdisable circuit is preferably connected to the node between the collector of the output transistor and the base of the output driver transistor.

In another application, from two to several hundred of such channels may be combined to form a simple multiplexer which can connect any one of two to several hundred inputs with a single output. In this case a separate input transistor is provided for each channel, while a multi-emitter transistor can provide the output transistor for several channels. When more than about ten channels are required, then several multi-emitter output transistors may be used, with the collectors of each output transistor connected together and the bases of each output transistor connected together.

The biasing of each channel, both to the low and ground voltages and to the high voltage provided by the power supply, is preferably via separate biasing circuits. The emitter pair biasing for each channel is controlled by a separate latch/current source transistor combination. Preferably, each active channel is separately referenced to ground to provide an accurate, repeatable bias level for each channel. Preferably, the collector of each input transistor is connected to the power supply through a separate biasing circuit. The latches may be programmed by a computer to provide a programmable, high-band width, low-distortion multiplexer amplifier.

In a multiple output application of the invention, an input may be connected to two or more of the amplifiers according to the invention, with each of the amplifiers having a separate output. A multiple output circuit, according to this application, may be programmed to connect a single input to any one of multiple outputs. Combining the simple multiplexer application with the multiple output application, a complex multiplexer may be made which is capable of connecting any one of two to several hundred inputs with one or both of two outputs, or one or many of multiple outputs.

When analyzed in another way, the multiplexing amplifier includes two portions: a switching portion and a feedback portion. A switching portion is provided for each input and for each output. The feedback portion is common for each output. This design allows a high density of multiplexing switches while still providing high signal integrity and wide band width.

In another application of the switchable amplifier according to the invention, several such amplifiers, each with a different gain, may be combined to provide a selectable gain circuit. The different gains are preferably provided by a different voltage divider circuit in the output loop of each amplifier. As in the simple multiplexer application, all of the amplifiers are connected to a common output. The gain of the common output is programmable by turning on the amplifier with the desired gain and turning off the other amplifiers.

In a further application of the programmable amplifier, several amplifiers may be combined to provide a selectable attenuation circuit. The different attenuations are preferably provided by a different voltage divider circuit inserted between a common input to the circuit and each of the inputs of the programmable amplifiers.

It is evident from the above that many other novel circuits may be formed by combining one or more of the above circuits. Each of these combinations yields a high-bandwidth, low-distortion amplifier circuit that is useful in instrumentation applications.

The invention provides a programmable amplifier comprising: an amplifier input and an amplifier output; a first amplifier channel between the input and the output, the first amplifier channel including an input transistor emitter and a first output transistor emitter, the input transistor emitter and the first output transistor emitter connected together to form a first emitter pair; selection means for selecting whether the first amplifier channel is to be activated; and activation means responsive to the selection means for activating the amplifier channel so that a signal applied to the input passes from the amplifier input, through the first amplifier channel, to the amplifier output if the amplifier is selected to be activated, and for deactivating the amplifier so that a signal applied to the input does not pass through the channel to the output if the amplifier is not selected to be activated. Preferably, the activation means comprises a current source and a switch means responsive to the selection means for connecting the current source to the emitter pair. Preferably, the switch means comprises a transistor and a latch. Preferably, the amplifier further includes outdisable means for placing the output in a state in which it appears electrically as an open circuit when the amplifier is selected to be off.

Preferably, the amplifier also includes emitter voltage control means for forcing the emitter pair to a controlled shut off voltage when the amplifier is not activated. Preferably, the amplifier further includes a second amplifier channel between the input and output, the second amplifier channel including a second input transistor emitter and a second output transistor emitter, the second input transistor emitter and the second output transistor emitter connected together to form a second emitter pair; and wherein: the selection means further comprises means for selecting at least one of the channels; and the activation means comprises means for activating the selected channel and deactivating the channel that is not selected. Preferably, the amplifier input includes a first input connected to the first amplifier channel and a second input connected to the second amplifier channel, the selection means comprises means for selecting one of the inputs, and the activation means comprises means for activating the channel connected to the selected input, whereby the amplifier electrically connects the selected one of the first and second inputs to the output. Preferably, the first amplifier channel further comprises a first gain means having a first gain, the second amplifier channel further comprises a second gain means having a second gain, the selection means comprises gain selection means for selecting a first gain or a second gain, and the activation means comprises means for activating the one of the channels having the selected gain.

In another aspect the invention provides an amplifier comprising: an amplifier input and an amplifier output; a first amplifier channel including a first input transistor emitter and a first output transistor emitter, the first input transistor emitter and the first output transistor emitter connected together to form a first emitter pair; a second amplifier channel including a second input transistor emitter and a second output transistor emitter, the second input transistor emitter and the second output transistor emitter connected together to form a second emitter pair; selection means for selecting one of the first and second amplifier channels; and activation means responsive to the selection means for activating the selected amplifier channel so that a signal applied to the input passes from the amplifier input, through the selected amplifier channel, to the amplifier output. Preferably, the activation means comprises a current source and a switch means responsive to the selection means for connecting the current source to the selected emitter pair, the switch means comprising a transistor and a latch. Preferably, the first amplifier channel includes a first emitter/base junction, the second amplifier channel includes a second emitter/base junction, and the amplifier further includes first biasing means connected to the first emitter pair for ensruing that the first emitter/base junction is held off when the first channel is not selected, and second biasing means connected to the second emitter pair for ensuring that the second emitter/base junction is held off when the second channel is not selected. Preferably, the amplifier also includes emitter voltage control means for forcing the first emitter pair to a controlled shut off voltage when the first amplifier channel is not activated and for forcing the second emitter pair to a controlled shut off voltage when the second amplifier channel is not selected.

In a further aspect, the invention provides a multiplexing amplifier comprising: a plurality of inputs; at least one output; a plurality of amplifier switching portions, each including a switch means for activating and deactivating the amplifier switching portion; an amplifier feedback portion; and wherein there is one of the amplifier switching portions for each of the inputs, the amplifier switching portion connected between its corresponding input and the output, and the amplifier feedback portion is common to the plurality of amplifier switching portions and is connected to the output. Preferably, there are a plurality of the outputs, there are I×O of the amplifier switching portions, where I is the number of the inputs and O is the number of the outputs, and there is one of the amplifier feedback portions for each of the outputs, and wherein there is a different one of the amplifier switching portions connected between each of the inputs and each of the outputs.

The invention not only provides a programmable amplifier probe with high band width and high signal integrity, but because the amplifier does not use any large capacitors, the amplifier and its applications can also be implemented in compact, relatively inexpensive, integrated circuit chips. Numerous other features, objects and advantages of the invention will become apparent from the following description when read in conjunction with the accompanying drawings.

DESCRIPTION OF THE PREFERRED EMBODIMENT

1. Overview

Figure 1:
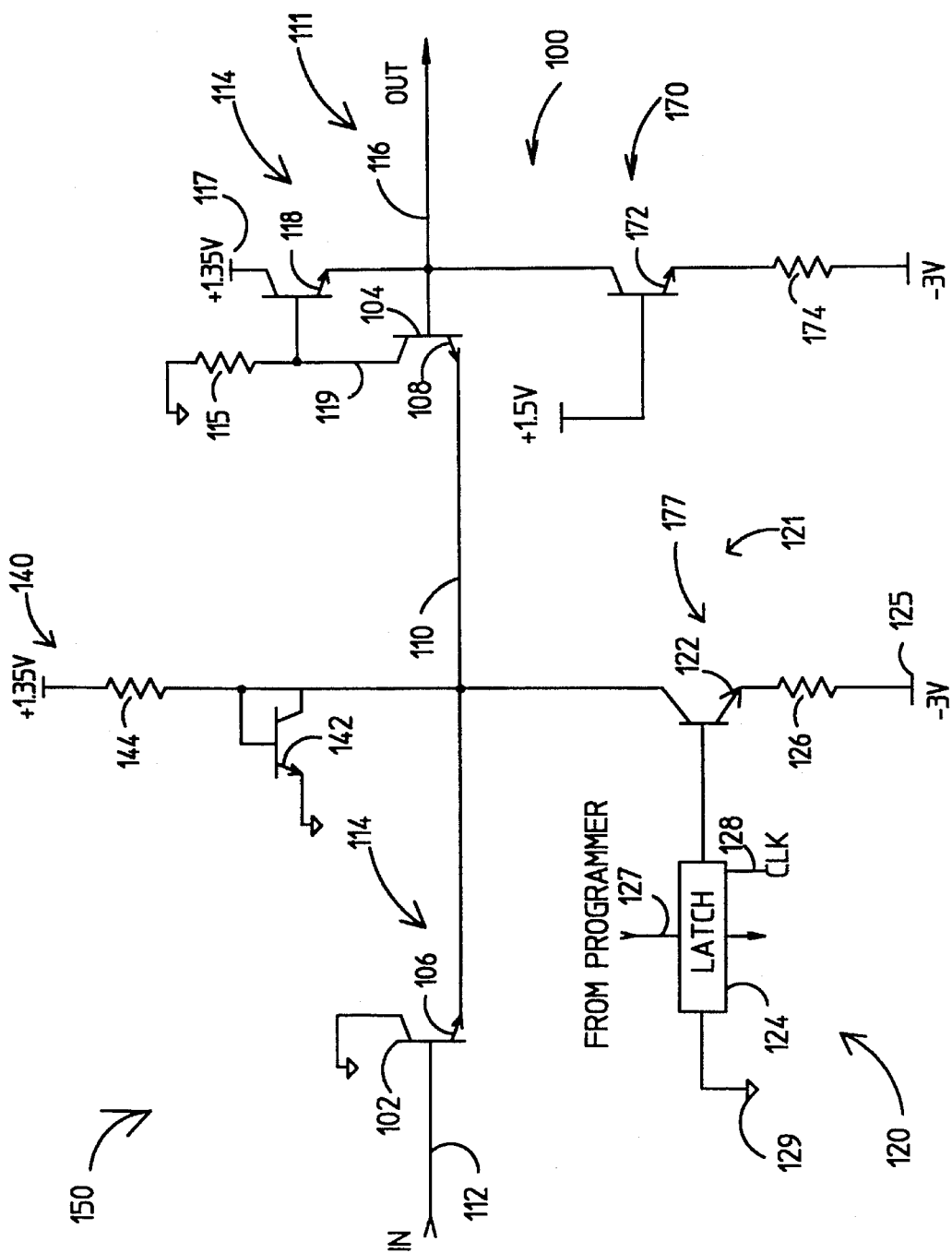
FIG. 1 is a circuit diagram of the preferred embodiment of a programmable amplifier according to the invention.

FIG. 1 shows the preferred embodiment of an amplifier 100 according to the invention. It should be understood that the specific system shown in the figures and described herein is exemplary. That is, it is intended to show preferred examples of the invention so that those skilled in the art can fully understand and implement it. It is not intended to limit the invention to the specific examples described and shown herein.

In this disclosure, the term "electrically connected" when applied to two electrical elements, such as an input and an output, means that an electrical signal, such as a voltage, a current, an analog signal, or a digital signal, will pass from one element to the other. This is in distinction to a physical connection by electrical components. For example, an input and an output may be physically connected by wires, amplifiers, transistors, resistors and other electrical components, but no signal will pass from the input to the output because one or more of the switching or amplification components may be off. In this case, the input and output are not "electrically connected". In this disclosure "amplifier" means an electronic circuit that passes signals, usually changing the amplitude, without significant distortion, and includes 1:1 amplifiers as well as negative amplifiers, not just amplifiers with a positive gain.

Amplifier 100 includes an input transistor 102, an output transistor 104 and an output driver transistor 118. The emitters of 106 and 108 of the two transistors are connected to form an emitter pair 110. The input 112 of the amplifier 100 connects to the base of transistor 102, while a feedback circuit 114 is connected between the collector and base of transistor 104. The output 116 of the amplifier is connected to the base of output transistor 104 and to the collector of output driver transistor 118 in the feedback loop 114, which transistor 118 drives the amplifier output 116 to provide additional gain. The node 119 connected to the collector of output transistor 108 and the base of output driver transistor 118 is connected to ground through resistor 115. The collector of transistor 118 is connected to +1.35 volt power source.

Figure 6:
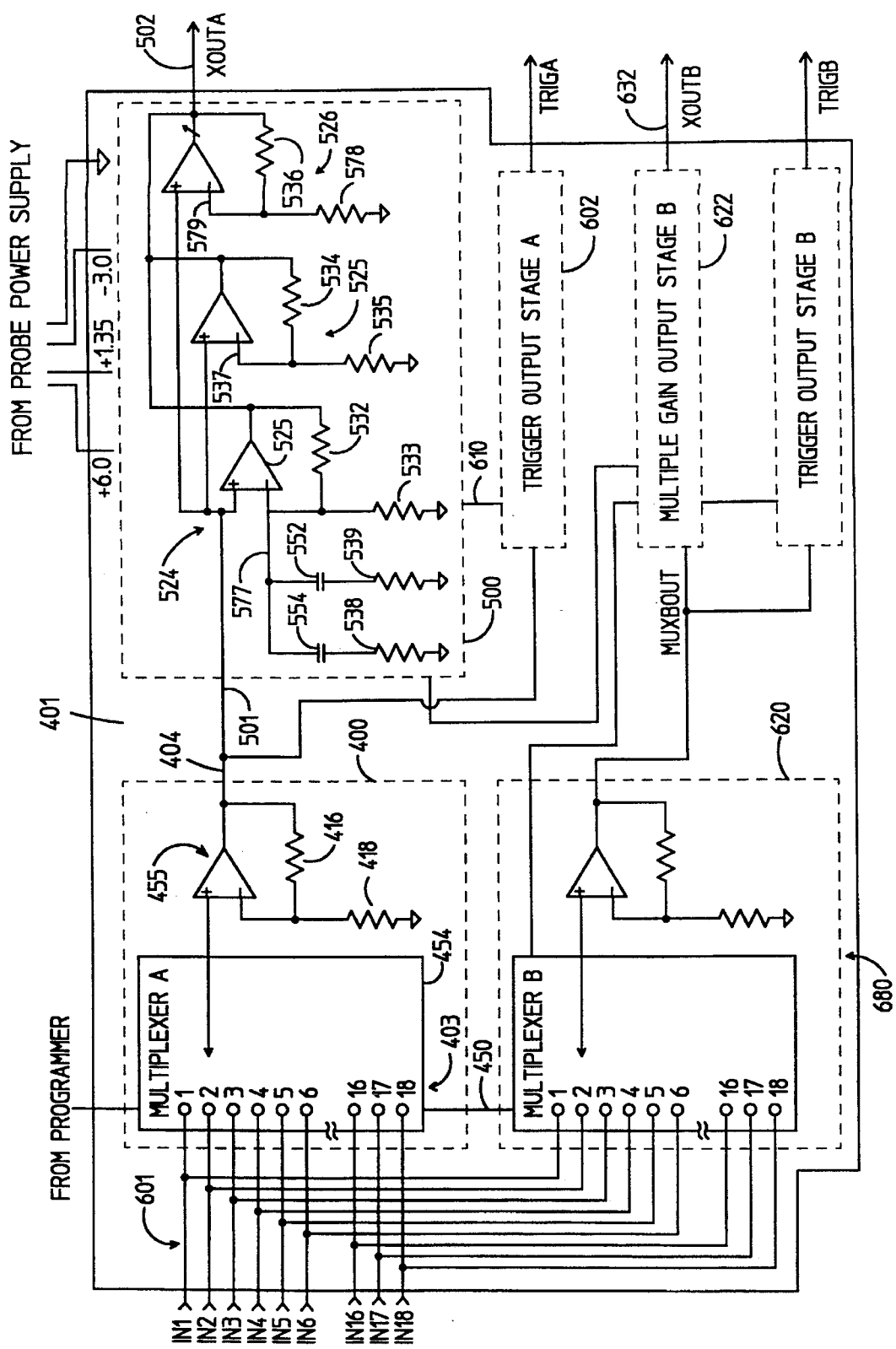
FIG. 6 is a block circuit diagram of an "X" type integrated circuit chip utilizing two of the simple multiplexers of FIG. 4 and two of the selectable gain output stages of FIG. 5, in a multiple output application, thereby forming a complex multiplexer.
Figure 8:
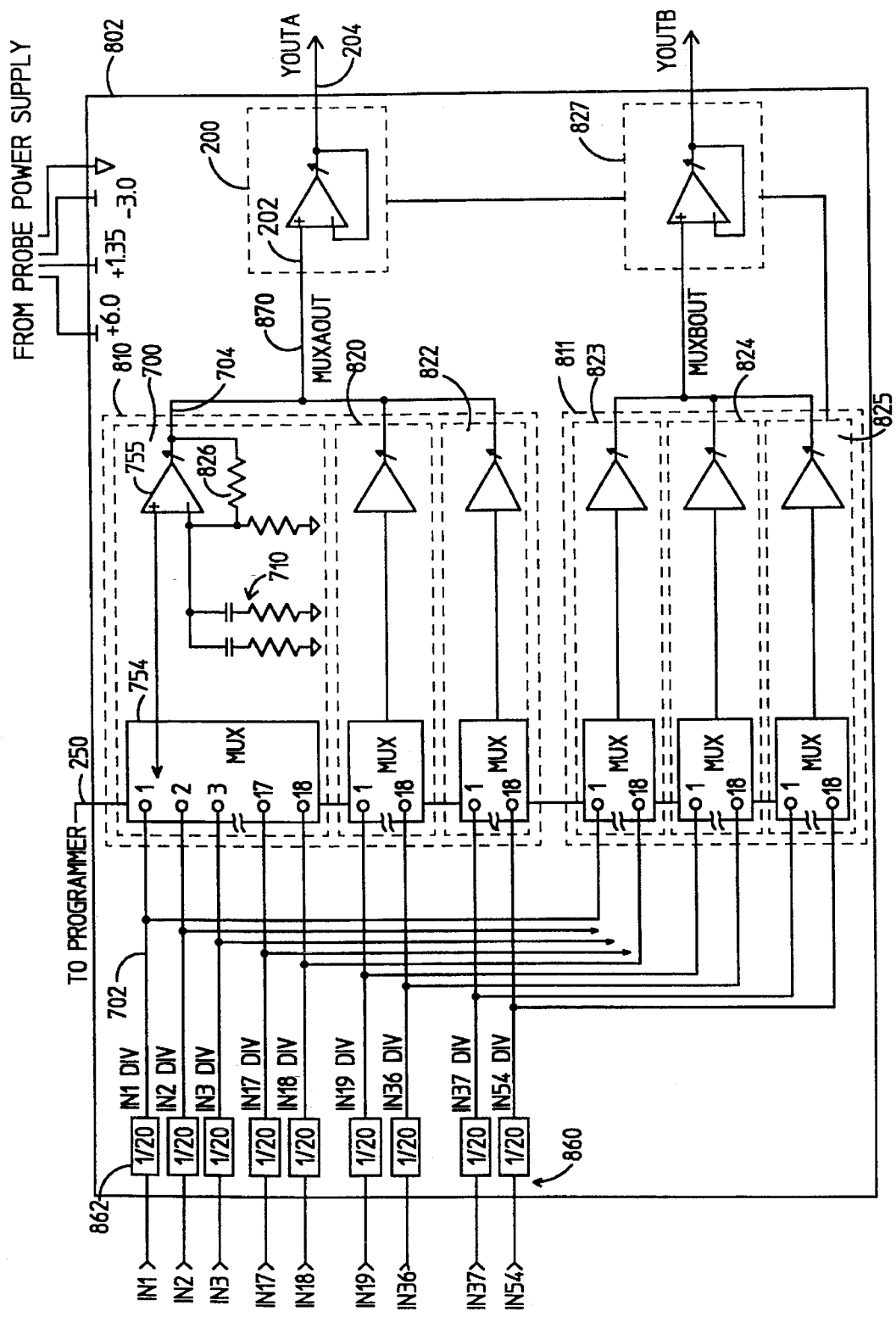
FIG. 8 is a block circuit diagram of a "Y" type integrated circuit chip utilizing six of the multiplexers of FIG. 7 and two of the programmable output stages of FIG. 2.

Note that in this disclosure voltage sources are shown as a line with the voltage written next to it, as at 117. The probe power supply 1024 (FIG. 10) provides voltages of +6.0 volts, +1.35 volts, and −3.0 volts as shown in FIGS. 6 and 8. Each of the integrated circuit (IC) chips which will be discussed below also has an on-chip circuit that generates −1.44 volts. Other intermediate voltages are obtained in a conventional manner by placing one or more diodes that attenuate the voltage between the line carrying the "high" or "low" voltage, as appropriate, and the portion of the circuit where the intermediate power source is shown.

Figure 10:
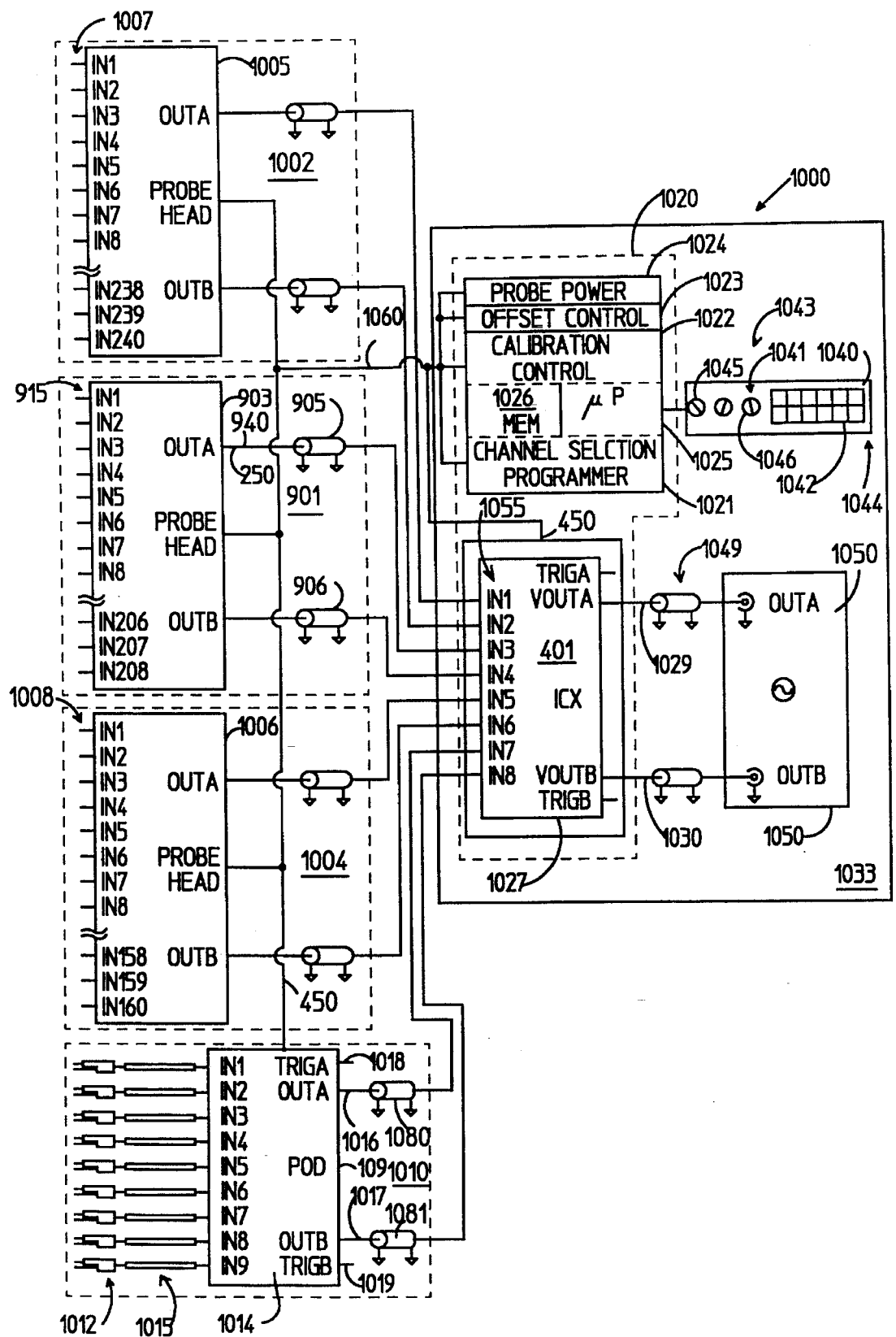
FIG. 10 is a block circuit diagram of a probe system utilizing numerous applications of the programmable amplifier according to the invention.

The programmability is provided by amplifier activation means 120 and selection means 1043, 1044 (FIG. 10). Activation means 120 includes current source 125, switch means 177 including transistor 122 and programmable latch 124, and resistor 126. The collector of transistor 122 is connected to the emitter pair 110, while its emitter is connected to the −3.0 volts power source through resistor 126. The output of latch 124 is connected to the base of transistor 122. The latch 124 is connected to programmer 1021 (FIG. 10) via data line 127 and clock line 128. As will be shown in more detail below, latch 124 is one of a series of latches that together form a shift register. Using an input device, 1041 (FIG. 10), such as a keyboard 1042 or a dial 1045, a user selects one or more amplifiers to be activated. The selection with input device 1041 cause the programmer 1121, which includes microprocessor 1025 and memory 1026, to clock a series of bits through the latches, such as 124, to program them. If latch 124 is programmed with a logic "1", its output goes high and transistor 122 turns on to connect emitter pair 110 to the low power supply, providing both the low bias to the base emitter junctions of transistors 102 and 104 to turn them on and the current source 125 to power them, which activates amplifier 100. If latch 124 is programmed with a logic "0", its output remains low and transistor 122 remains off holding amplifier 100 in the deactivated condition. As will be discussed in more detail below, each bank of latches is separately grounded to ensure a stable and accurate bias level for the activation means 120. In this disclosure, grounds are indicated by a triangle, as at 129.

The amplifier 100 thus provides a "channel" 111 from input 112 to output 116 which can be programmed to be ON or OFF. When the amplifier 100 is OFF, signals placed on input 112 have no effect on output 116. When amplifier 100 is ON, signals placed on input 112 pass to output 116 with little distortion for band-widths of from DC to the gigahertz range. This basic amplifier can be used to provide a single channel (FIG. 2) that can be programmed to be either ON or to be in a high impedance, essentially no current OFF state that essentially appears as an open circuit to external circuits, to provide a multi-channel multiplexer (FIG. 4), to provide a selectable gain output stage (FIG. 5), to provide a selectable attenuation channel input stage (FIG. 11), and to provide many other single and multi-channel devices.

Returning to FIG. 1, emitter pair 110 is also connected to OFF state biasing circuit 140, which includes transistor 142 and resistor 144. The collector and base of transistor 142 are connected to the emitter pair 110 and the emitter is connected to ground. As is known in the art, in this configuration, transistor 142 acts as a diode with the cathode connected to ground. The emitter pair 110 is also connected to the +1.35 volt voltage supply through resistor 144. OFF state biasing circuit 140 forces emitter pair 110 to a controlled shut-off voltage when amplifier 100 is not activated, and further assists in reducing coupling between adjacent amplifiers, i.e. adjacent channels. Preferably the controlled shut-off voltage is about 0.75 volts, which reverse biases the base/emitter junctions of transistors 102 and 104 when latch 124 is off.

The amplifier 100 also includes power supply biasing circuit 150. The collector of transistor 102 is connected to ground. As will be seen below, each channel of multi-channel devices has separate power supply biasing. Each output channel has its own separate power source, i.e. a separate connection to the power supply for the chip, which power source supplies power to that channel from input to output. This prevents adjacent channels from "talking" via the power supply. Thus, it provides isolation when the channel is off.

Amplifier 100 also includes biasing circuit 170, which includes transistor 172 and resistor 174. The collector of transistor 172 is connected to the emitter of output driver transistor 118 and its emitter is connected to the −3.0 volts power source through resistor 174. The base of transistor 172 is connected to a +1.5 volt power source. Biasing circuit 170 provides current to output driver transistor 118 so that the transistor turns on when the rest of the circuit 100 comes on and turns off when the rest of the circuit 100 turns off.

Preferably, all transistors in this circuit and in other circuits of this disclosure are bipolar NPN transistors. The latch 124, and the other latches discussed below, may be any device having an output that may be latched in either of two states: a "low" or logic "0" state that in this embodiment is preferably about −2.6 volts, and a "high" or logic "1" state that in this embodiment is about +1.6 volts. The types and values of the other electronic components depend on the application, and examples will be given below.

Below we shall discuss several preferred embodiments of the amplifier according to the invention and then, in FIG. 10, show how these embodiments may be integrated into a probe system 1000. These preferred embodiments of the amplifier are implemented on integrated circuit chips. This allows large numbers of channels to be placed in a small package, such as a hand-held probe body. It is an important feature of the invention that the design of the basic amplifier allows several amplifiers to be placed very close together without coupling between the amplifiers, and still provide the high band width and low distortion required for instrumentation amplifiers. Thus the design of the amplifier leads to the ability to incorporate many of such amplifiers in an integrated circuit, and thus provide a new dimension in instrumentation.

2. Detailed Description of Applications of the Amplifier

Figure 2:
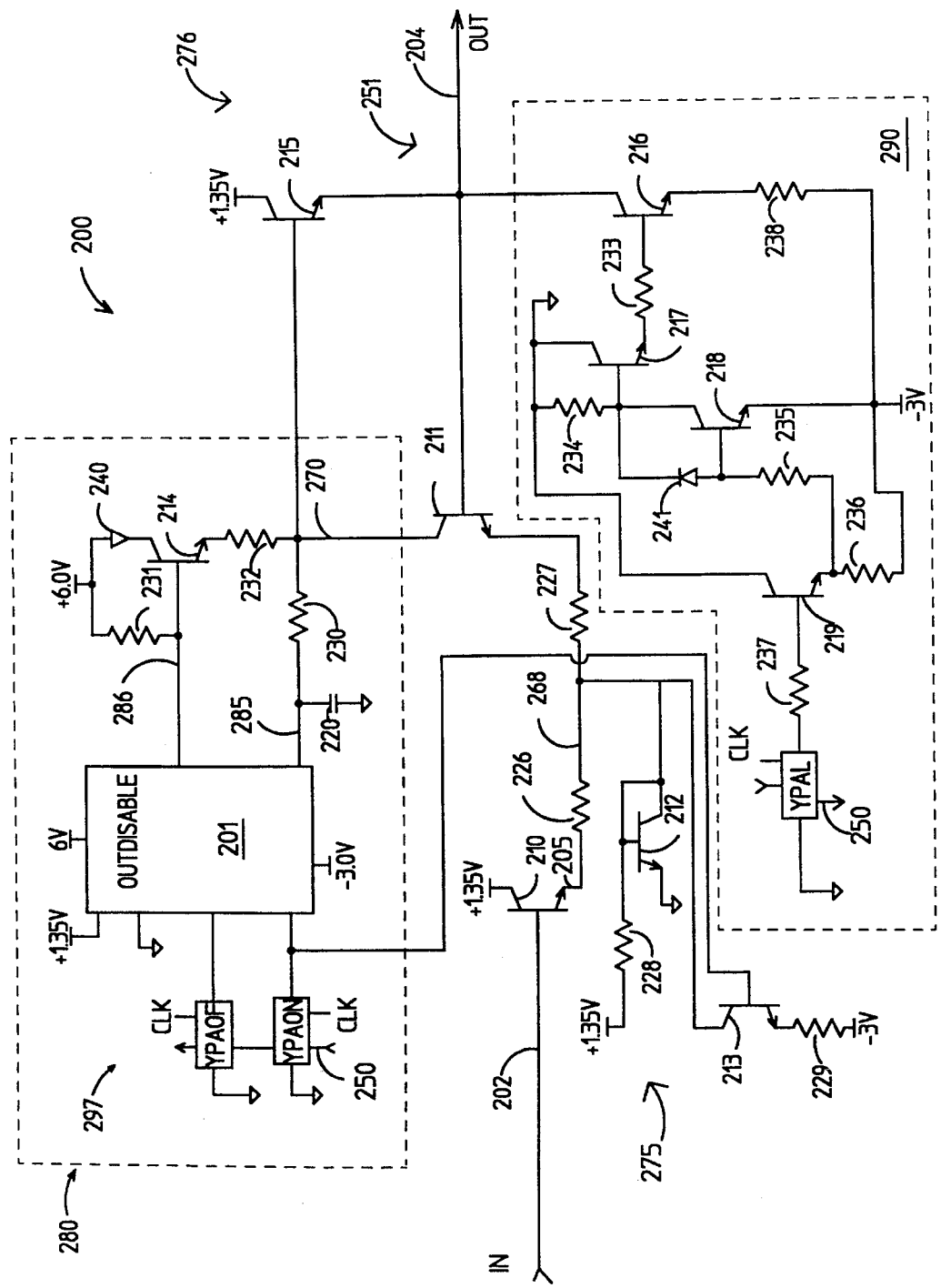
FIG. 2 is circuit diagram of programmable output stage utilizing a variation of the programmable amplifier of FIG. 1.

Turning to FIG. 2, a preferred embodiment of programmable output stage 200 used in probe 1000 is shown. Circuit 200 includes outdisable circuit 201, input 202, output 204, latches YPAON, YPAOF and YPAL, transistors 210–219, capacitor 220, resistors 226–237, and diodes 240 and 241. Input 202 is connected to the base of transistor 210. The collector of transistor 210 is connected to a +1.35 volts power source, while the emitter is connected to the emitter of transistor 211 through resistors 226 and 227 connected in series. The base of transistor 211 is connected to the output 204, while the collector is connected to node 270, which is equivalent to node 119 in the circuit of FIG. 1. The node 268 between resistors 226 and 227 is connected to the collectors of transistors 212 and 213, the base of transistor 212, and a +1.35 volts power source through resistor 228. The emitter of transistor 212 is connected to ground. The emitter of transistor 213 is connected to the −3.0 volts power supply through resistor 229. The base of transistor 213 is connected to the output of latch YPAON. Latches YAON, YAOF, and YAL are connected to the serial data line 250 which comes most directly from latch YA18 (FIG. 7), but ultimately from the programmer 1121. Latches YAON and YAOF provide the VLATCHON and VLATCHOFF signals to outdisable circuit 201. Outdisable circuit 201 is also connected to a +1.35 volts power source, the +6.0 volts power source, and the −3.0 volts power source. It provides a voltage VOFF of about 0.1 volts on its output 285 and a current IOFF of about 0.5 milliamps on its output 286. Line 285 is connected to ground through capacitor 220 and to the node 270 through resistor 230. Capacitor 220 and resistor 230 provide high frequency compensation for the amplifier. Line 286 is connected to the base of transistor 214. The base of transistor 214 is connected to the +6.0 volts power source through resistor 231. The collector of transistor 214 is connected to the cathode of diode 240, and the anode of the diode is connected to the +6.0 volt power source. The emitter of transistor 214 is connected to the node 270 through resistor 232. Node 270 is connected to the collector of transistor 211 and to the base of transistor 215, which performs a similar function as transistor 118 in FIG. 1, except that its OFF state is more closely controlled by circuit 280. The collector of transistor 215 is connected to a +1.35 volts power source and its emitter is connected to the output 204 and the base of transistor 211. The collector of transistor 216 is connected to the output 204, its emitter is connected to the −3.0 volts power source through resistor 238, and its base is connected to the emitter of transistor 217 through resistor 233. The collector of transistor 217 is connected to ground and its base is connected to the collector of transistor 218, to ground through resistor 234, and to the cathode of diode 241, the anode of which is connected to the base of transistor 218 and to the emitter of transistor 219 through resistor 235. The emitter of transistor 219 is connected to ground through resistor 236, and its collector is connected to ground. The base of transistor 219 is connected to the output of latch YPAL.

Preferably, capacitor 220 has a value of 0.2 picofarads, and resistors 226–238 have the values 20 ohms, 20 ohms, 1.9 Kohms, 125 ohms, 500 ohms, 14 Kohms, 2.0 Kohms, 250 ohms, 14 Kohms, 7 Kohms, 14 Kohms, 7 Kohms, and 250 ohms respectively. The latches are labeled with designations, such as YPAON, YPAON, and YPAL, that indicate their relative position in the circuit and in a shift register 297 that is part of the probe system of FIG. 10. These designations will be explained in detail in connection with FIG. 10.

Figure 3:
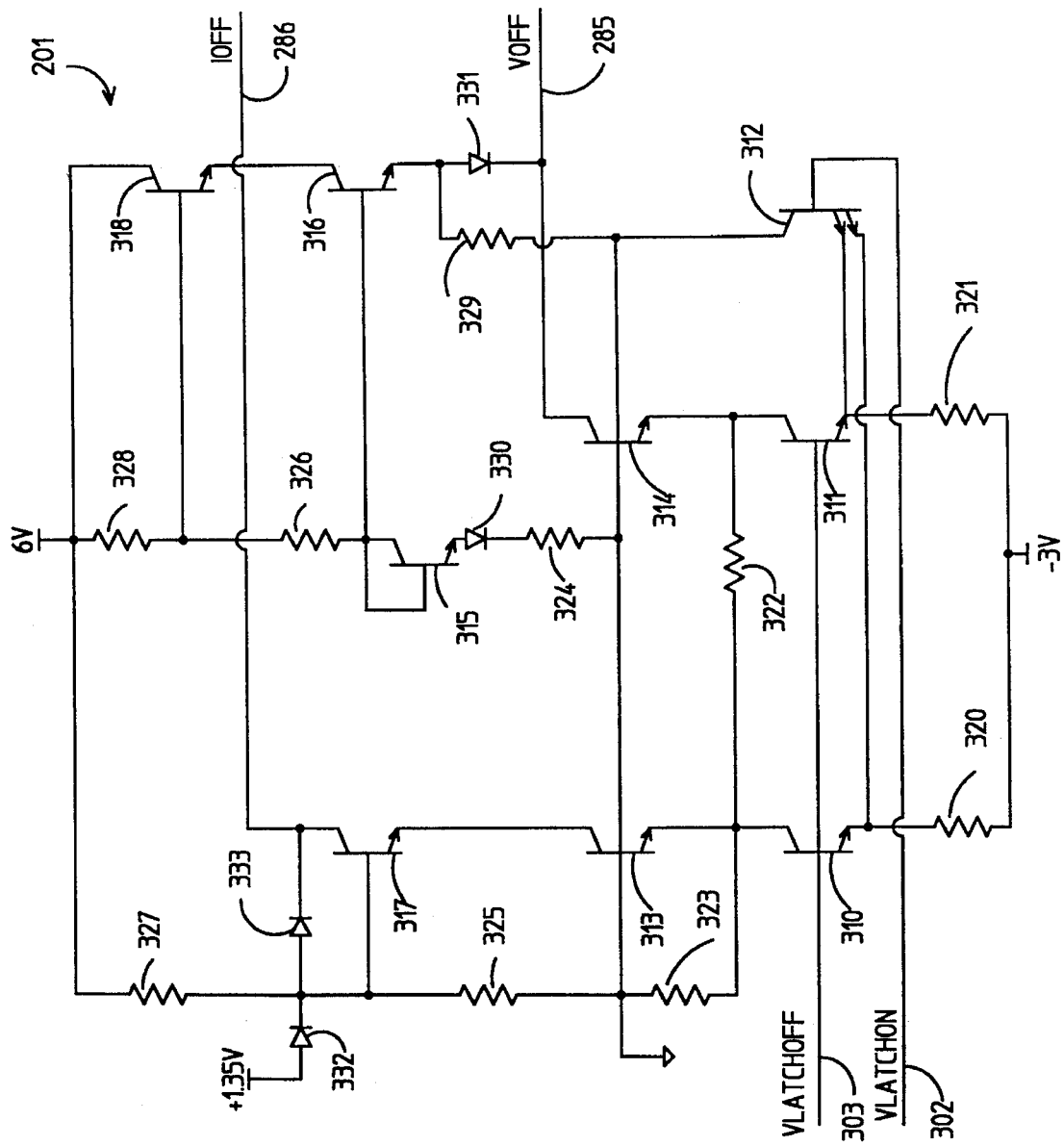
FIG. 3 is a circuit diagram of the outdisable circuit utilized in the programmable output stage of FIG. 2.

FIG. 3 shows a detailed circuit diagram of the outdisable circuit 201 which forms part amplifier 200 (FIG. 2). This circuit provides a current IOFF on its output 286 and a voltage VOFF on its output 285 in response to signals VLATCHON and VLATCHOFF placed on its inputs 302 and 303, respectively. Outdisable circuit 201 includes transistors 310–318, resistors 320–329, and diodes 330–333. Transistor 312 is a two-emitter transistor. The input 303 is connected to the bases of transistors 310 and 311. The input 302 is connected to the base of transistor 312. The emitters of transistors 310 and 311 are connected to one of the emitters of transistor 312 and to the −3.0 volt power source through resistors 320 and 321, respectively. The collector of transistor 312 is connected to ground. The collectors of transistors 310 and 311 are connected through resistor 322. The collector of transistor 310 is also connected to the emitter of transistor 313 and to ground through resistor 323, while the collector of transistor 311 is also connected to the emitter of transistor 314. The bases of transistors 313 and 314 are connected to ground. The collector of transistor 314 is connected to output 285. The collector of transistor 313 is connected to the emitter of transistor 317. The base of transistor 317 is connected to ground through resistor 325, to its collector through diode 333, which has its cathode connected to the collector, to a +1.35 volts power source through diode 332, which has its anode connected to the power source, and to the 6.0 volt power source through resistor 327. The collector of transistor 317 is also connected to output 286. The emitter of transistor 315 is connected to ground through diode 330 and resistor 324 in series, with the anode of the diode connected to the emitter. The emitter of transistor 316 is connected to ground through resistor 329 and to the anode of diode 331, the cathode of which is connected to output 285. The bases of transistors 315 and 316 are connected to the +6.0 volts power source through resistors 326 and 328 in series. The node 340 between resistors 326 and 328 is connected to the base of transistor 318. The emitter of transistor 318 is connected to the +6.0 volt power source. The emitter of transistor 318 is connected to the collector of transistor 316. Preferably, resistors 320–329 have the values 1.1 Kohms, 5.0 Kohms, 32.5 Kohms, 32.5 Kohms, 2.0 Kohms, 97.5 Kohms, 40.0 Kohms, 65 Kohms, 40.0 Kohms, and 32.5 Kohms, respectively. The outdisable circuit provides a voltage VOFF of about 0.1 volts on output 286 and a current IOFF of about 0.5 milliamps on its output 286.

The amplifier circuit 200 essentially comprises a feedback operational amplifier 275, including a feedback loop 276, a programmable OFF circuit 280, and a biasing circuit 290. Amplifier 200 differs from the basic amplifier 100 in that it includes resistors 226 and 227 connected between the emitter pair 205 and 206, the biasing circuit 290 is more complex than the circuit 170 in FIG. 1 and is programmable, and it includes the programmable OFF circuit 280. Resistors 226 and 227 reduce the loop gain of amplifier 275. The biasing circuit 290 is equivalent to the circuit 170; that is bias circuit 170 is a general representation of a bias circuit, while circuit 290 is an actual implementation of such a circuit. Circuit 290 provides bias current to the emitter of transistor 215 when YPAL is low and provides no current when YPAL is high, so that transistor 215 will shut off and the output is disabled.

The function of the programmable OFF circuit 280 is, in conjunction with biasing circuit 290, to keep transistor 214 off when the amplifier 275 is off. In a typical application of programmable output circuit 200, for example the application shown in FIGS. 8 and 9, the output 204 will see voltages due to the outputs from other circuits that are daisy-chained to a probe head output line such as 924. Without circuit 280, when transistor 213 is off, that is, when amplifier 275 is off, node 270 would rise to approximately +2.1 volts, which, in combination with some voltages that can appear on output 204, could turn on transistor 215. The IOFF current applied to the base of transistor 214 holds this transistor off and ensures that no current flows through the amplifier to or from output 204. With transistor 214 off, node 270 would float. The voltage VOFF generated by outdisable circuit 201 holds node 270 at about 0.1 volts, which together with the biasing provided by biasing circuit 290 when latch YPAL is on, holds transistor 215 off for any reasonable voltages that can appear on the output 204. The combination of IOFF and VOFF results in output 204 appearing as an open circuit to any circuit connected to it. Thus, circuit 200 provides a single channel 251 that is programmable to be either in an ON state in which, over a wide band width of frequencies, it passes signals applied to input 202 to output 204 with little distortion, or an OFF state in which output 204 is in a high impedance, no current state that resembles an open circuit. As will be seen below, this feature allows many IC chips to be daisy-chained to the probe output, greatly increasing the number of channels that can be placed in a probe system utilizing just two custom IC chips.

Figure 4:
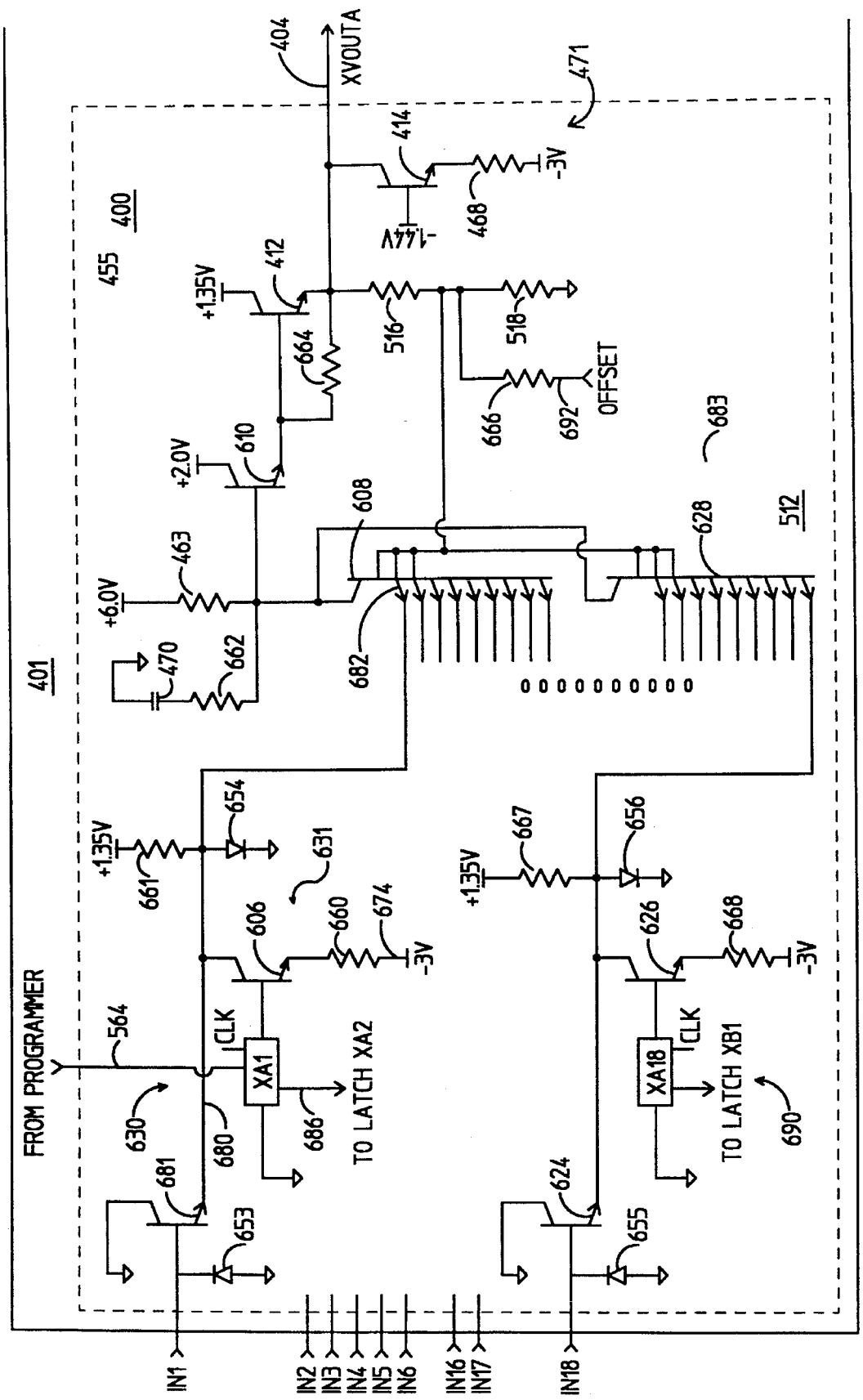
FIG. 4 is a circuit diagram of a simple multiplexer utilizing eighteen of the programmable amplifiers according to the invention.

FIG. 4 shows a detailed circuit diagram of a simple multiplexer amplifier 400 which utilizes eighteen feedback operational amplifiers 402 similar to the amplifier 100 of FIG. 1 to connect any one of eighteen inputs 403 to a single output 404. Multiplexer amplifier (muxamp) 400 is implemented as a portion of a "X" type integrated circuit (ICX) 401 (FIG. 6). Muxamp 400 includes eighteen inputs 403, transistors 406, 407, 408, 410, 412, and 414, latches XA1 through XA18, diodes 451 and 454, resistors 416, 418, and 460 through 466, capacitor 470, and output 404. Transistors 408 and 428 are nine emitter transistors. Preferably resistors 416, 418 and 460 through 466 have the values 100 ohms, 88 ohms, 125 ohms, 2 Kohms, 500 ohms, 2.3 Kohms, 1 Kohm, 200 ohms, and 1.8 kohms, respectively. Capacitor 470 preferably has a value of 0.2 picofarads.

Each of the eighteen operational amplifiers 402 comprises two transistors, such as 407 and 408, with their emitters, such as 481 and 482, connected to form an emitter pair 480. In the implementation shown, transistor 408 is a nine-emitter transistor, so it acts as the second transistor for the first nine of the differential amplifiers, while a second nine-emitter transistor 428 acts as the second transistor for the last nine of the differential amplifiers. Output driver and feedback portion 455 provides the output driver and feedback for all eighteen op-amps 402. As will be clear from the following, each of these eighteen op-amps 402 defines a separate multiplexer channel.

The In1 input 403 is connected to the base of transistor 407 and is also grounded-through diode 451, which has its anode connected to ground. In this configuration, diode 451 protects against excessive negative voltages applied to the input In1. Diode 451 begins to turn on when the negative voltage on the input reaches about −0.7 volts. Protection against positive voltage excursions is provided by the collector/base junction of transistor 407, which, as known in the art, is essentially a diode. The collector of transistor 407 is connected to ground.

The separate biasing of each channel, i.e. the separate connection of each channel to the power supply, prevents adjacent channels from "talking" via the power supply. Thus, it provides isolation when the channel is off. The emitter pair 480 is connected to the collector of transistor 406. The base of transistor 406 is connected to the output of latch XA1. Data line 450 applies the data signal to a shift register 497 which includes latches XA1 through XA18. A clock signal is also applied to clock the latch, as is known in the art. Latches XA1–XA18 are also connected to ground to produce an accurate, repeatable bias level for each control switch, such as that comprising latch XA1 and transistor 406. Note that since each bank of latches, such as XA1–XA18, are associated with one output, such as 404, or in terms of the chip 401, output 502, and each output has a separate power source and ground, each active channel will be separately powered and grounded, thus isolating the active channels from one another. The emitter of transistor 406 is connected to the −3.0 volt power source through resistor 460. When latch XA1 goes high, it turns transistor 406 on, which provides a current source for the op-amp circuit 402 passing through the first emitter of transistor 408 and including transistor 407, activating this op-amp and thus turning on channel I of the "A" multiplexer 400 of ICX 401 (FIG. 6). This electrically connects the input associated with this channel to the muxamp 400 output 404, and ultimately to the selected output 1029 or 1030 of probe 1000 (FIG. 10).

Returning to the discussion of FIG. 4, the circuit 405 between input In18 and the last emitter of transistor 428 is identical in structure and function as the circuit between input In1 and the first emitter of transistor 406, except that the latch XA18 is in a different position in the shift register of latches and thus its function will be determined by the bit in that position. The former circuit defines the first channel 490 associated with the "A" section multiplexer 400, while the latter circuit defines the eighteenth channel 440 associated with "A" section multiplexer 400. Likewise, there is a similar circuit between each of the other inputs In2 through In17 and the corresponding emitter, each of which define a multiplexer channel. Each of these circuits comprise an emitter pair amplifier, including an input transistor emitter 481, 443, an output transistor emitter 482, 444, forming an emitter pair 480, 442, an activation means 445 including: a current source, such as 474; and a switch means 477 comprising a transistor, such as 406, and a latch, such as XA1. The switch means 477 connects the current source 474 to the amplifier 480 to activate the amplifier when a logic "1" is shifted into latch XA1 via data line 450 and the latch goes high to activate transistor 406.

The collectors of transistors 408 and 428 are connected to the base of transistor 410, to a +6.0 volt power source through resistor 463, and to the ground through resistor 462 and capacitor 470 connected in series. The collector of transistor 410 is connected to a +2.0 volt power source, and its emitter is connected to the base of transistor 412 and the muxamp output 404 through resistor 464. The collector of transistor 412 is connected to the +1.35 power source and its emitter is connected to output 404. The output 404 is also connected to the bases of transistors 408 and 428 through resistor 416 to provide feedback. The bases of transistors 408 and 428 are also connected to ground through resistor 578 and to the offset voltage input 492 through resistor 466.

The offset voltage is applied from calibration control module 1022 (FIG. 10) and provides a means for trimming the muxamp 400 circuit for calibration purposes.

Muxamp 400 can be thought of as including an 18:1 multiplexer 453 and a output driver amplifier 455. It also includes eighteen power supply biasing circuits 477, one for each of the eighteen amplifier circuits, such as 402, and biasing circuit 471. The power supply biasing circuits, such as 449, and the biasing circuit 471 are the same as the circuits 150 and 170, respectively, in FIG. 1, and thus won't be discussed again. The output driver circuit 455 includes two output driver transistors 410 and 412 connected with a biasing resistor 464. It also includes a voltage divider comprising resistors 416 and 418, which gives the muxamp 400 an overall gain of 2.1, and it includes the offset voltage adjustment circuit mentioned above. Resistor 462 and capacitor 470, like resistor 230 and capacitor 220 in FIG. 2, provide high frequency compensation for the amplifier 400. Thus, by combining eighteen operational amplifiers according to the invention, muxamp 400 provides a simple eighteen channel multiplexer that passes a selected one of the signals input on the eighteen inputs 403 to its output 404 with little distortion, over a wide band width of frequencies.

Figure 5:
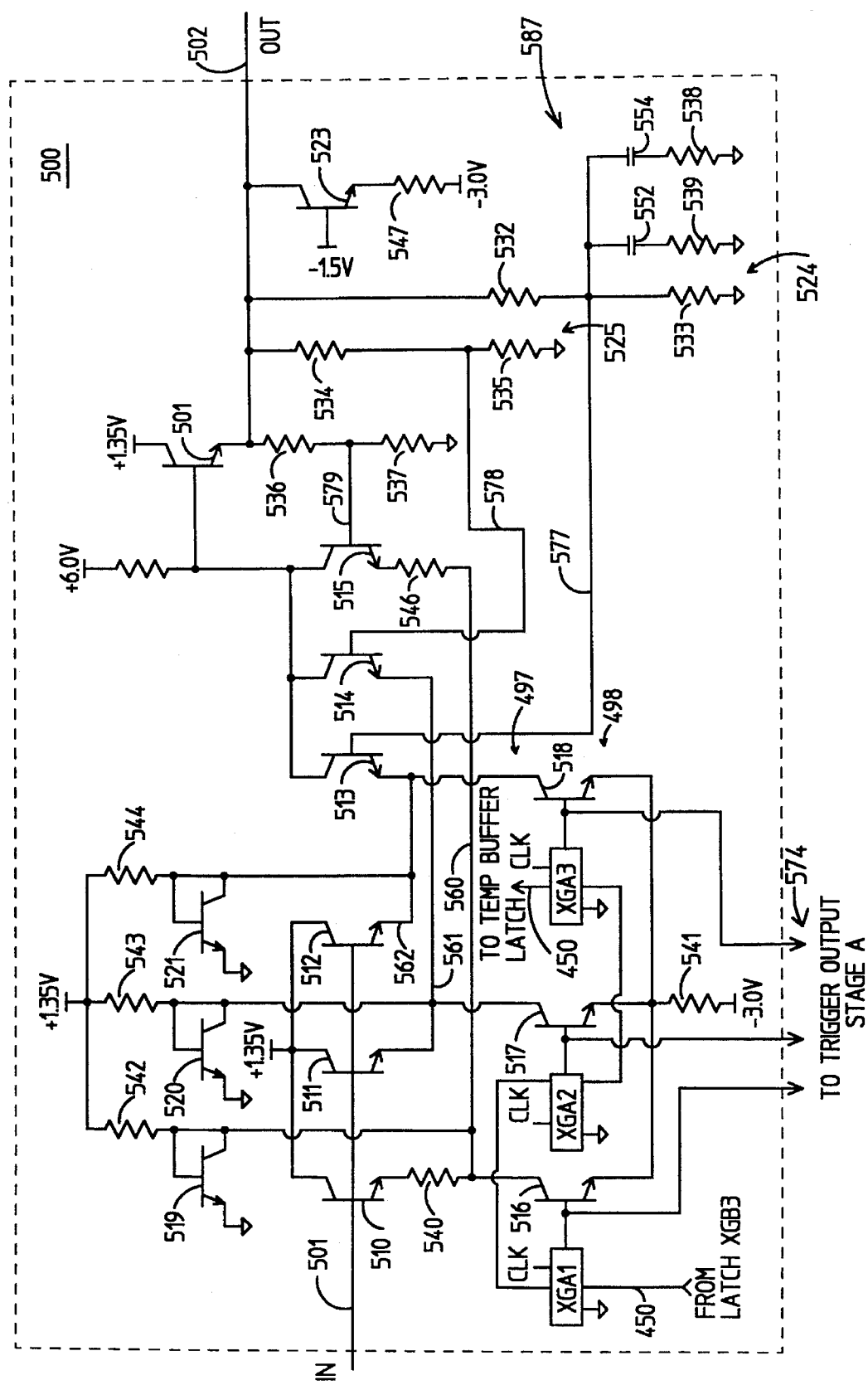
FIG. 5 is a circuit diagram of a selectable gain output stage utilizing three programmable amplifiers according to the invention.

Another embodiment of the programmable amplifier according to the invention is shown in FIG. 5. In this embodiment, three programmable amplifiers 524, 525, and 526, each with a different gain, are combined to provide a selectable gain circuit 500. Selectable gain circuit 500 includes input 501, output 502, transistors 510–523, latches XGA1–XGA3, resistors 532–547, and capacitors 552 and 554. The bases of transistors 510, 511, and 512 are connected to the output stage input 501, while their collectors are connected to a +1.35 volts power source. The emitter of transistor 510 is connected to the emitter of transistor 515 through resistors 540 and 546 in series. The node 560 between the resistors is connected to the collector of transistor 516. The emitter of transistor 511 is connected to the emitter of transistor 514 and to the collector of transistor 517. The emitter of transistor 512 is connected to the emitter of transistor 513 and to the collector of transistor 518. Each of the collectors of transistors 513, 514, and 515 are connected to the +6.0 volts power source through resistor 545 and to the base of output transistor 522. The emitters of transistors 516–518 are connected to the −3.0 volts power source through resistor 541. The outputs of latches XGA1, XGA2, and XGA3 are connected to the bases of transistors 516, 517, and 518, respectively, and also are connected to the base of the corresponding transistor in the corresponding trigger output stage 602 (FIG. 6) via line 574. Each latch is serially connected along the shift register data line 450, which comes most immediately from the XMB3 latch and ultimately from the programmer 1121 (FIG. 10), and, after passing through latches XMA1, XMA2, and XMA3, goes to the latch of a temperature buffer circuit (not shown) in the ICX chip. As discussed above, each latch also has a clock input, and is grounded. Similarly to the circuits associated with the latches in FIG. 1, each latch/transistor, such as XGA2/517, provides a switchable current source for the associated op-amp, such as that comprising transistors 511 and 513, which current source can be turned on and off by the latch to control which of the amplifiers 524, 525, or 535 that the signal input on line 501 passes through.

Each node 560, 561, and 562 between the emitter pairs of the three differential amplifiers is connected to the +1.35 volt power source through a resistor, such as 543, and is connected to the collector and base of a transistor, such as 520, which has its emitter connected to ground, in which configuration the transistor, such as 520, acts as a diode. This circuit ensures that the base/emitter junction of transistors, such as 511 and 514, is reverse biased when the corresponding latch, such as XGA2, is off, so that these transistors remain off. In addition, this arrangement causes the diodes, such as 520, to turn on when the latch, such as XGA2, is off, and connect the node to ground, which prevents any signal from coupling through the corresponding operational amplifier.

The collector of transistor 522 is connected to a +1.35 volt power supply and its emitter is connected to output 502. The base of transistor 515 is connected to the output 502 through resistor 536 and to ground through resistor 537. The base of transistor 514 is connected to the output 502 through resistor 534 and to ground through resistor 535. The base of transistor 513 is connected to the output 502 through resistor 532 and to ground through resistor 533. Each of these pairs of resistors, such as 532 and 533, provide a voltage divider that determines the gain of the corresponding amplifier, such as 524.

The base of transistor 513 is also connected to ground through capacitor 552 and resistor 539 in series, and to ground through capacitor 554 and resistor 538 in series. This circuit 587 provides cable compensation for operational amplifier 524.

The collector of transistor 523 is connected to the output node 542, and its emitter is connected to the −3.0 volt power source through resistor 547. Its base is connected to a −1.44 volt power source. This biasing circuit is the same as circuit 170 in FIG. 1 and performs the same function.

From the above, it can be seen that the selectable gain output stage 500 comprises three programmable operational amplifiers 524, 525, and 526, which share an output driver transistor 522. For example, programmable amplifier 525 comprises transistors 511,514, and 517, latch XGA2, resistors 534, 535, 541 and 543, and diode 520, together with output transistor 522. The feedback that makes this a feedback amplifier 525 is provided through resistor 534 and node 578, and the voltage division that determines the gain of amplifier 525 is provided by resistors 534 and 535. The programmability is provided by activation means 498, which is the same as the activation means 120 in FIG. 1. For example, the amplifier 525 is programmed by the data applied to the shift register that includes latch XGA2. If latch XGA2 holds a logic "0" the latch and programmable amplifier 535 is programmed to be OFF and if latch XGA2 holds a logic "1" the latch and programmable amplifier 535 are programmed to be ON. Similarly the latch XGA1 determines whether amplifier 524 is ON or OFF, and latch XGA3 determines whether amplifier 526 is ON or OFF.

Preferably, resistors 532–547 have the values 125 ohms, 105 ohms, 125 ohms, 105 ohms, 90 ohms, 1.1 Kohms, 420 ohms, 1.5 Kohms, 20 ohms, 125 ohms, 2 Kohms, 2 Kohms, 2 Kohms, 2.7 Kohms, 20 ohms, and 100 ohms, respectively. Preferably, capacitors 552 and 554 are 1 picofarad and 6 picofarads, respectively. These values result in a gain of 2.2 with cable compensation for amplifier 524, a gain of 2.2 for amplifier 525, and a gain of 1.1 for amplifier 526. Thus, the combination of three programmable amplifiers according to the invention, each with a different voltage divider circuit, results in a selectable gain circuit 500 that, for a wide band width of frequencies, passes a signal input on line 501 to output 502 with little distortion and the selected gain, and also with cable compensation if amplifier 524 is selected.

FIG. 6 shows a block circuit diagram of the type "X" integrated circuit 401 which we shall also refer to as an ICX circuit for shod. ICX 401 has eighteen inputs 601 which are connected to each of two channels, which are designated channel "A" and channel "B". Each of the "A" and "B" channels are identical and are made up of a muxamp 400 that is identical to the muxamp 400 in FIG. 4, and a selectable gain output stage 500 which is identical to the selectable gain circuit 500 in FIG. 5. Some components of muxamps 400 and selectable gain circuit 500 are shown in the "A" channel for ease of reference, for example nodes 577, 578 and 579 correspond to the nodes with the same numbers in FIG. 5. However, it should be noted that transistors 408 and 428 in FIG. 4 form part of both the multiplexer 454 and the output driver amplifier 455, though this is not possible to show in the notation of FIG. 6. Each of the "A" and "B" channels also includes a trigger output stage, such as 602. Trigger output stage 602 is the same as selectable gain output stage 500, except it does not include the cable compensation capacitors and resistors, since in the applications in which long cables connected to output stages are used, the trigger output stages are not used; also, it does not include the latches XGA1–XGA3, but instead utilizes the signals from latches XGA1–XGA3 in the output stage 500 via line 610. Since the trigger output stage 602 input is connected to the input 501 of the selectable gain output stage 500, whenever a multiplexer channel, for example the channel associated with input In6, is selected in the selectable gain output stage 500, the corresponding channel, e.g. channel 6, is selected for the trigger output stage 602. The use of the output of the latches XGA1–XGA3 by the trigger output stage 602 eliminates three latches in each "A" and "B" channel and ensures that the gain for the trigger output stage 602 will be the same as for the selectable gain output stage 500.

As indicated above, each ICX chip input 601 connects both to the "A" channel and the "B" channel. In each channel, the output 404 of the muxamp 400 becomes the input 501 of the selectable gain output stage 500 and the trigger output stage 602. Thus, ICX chip 401 is a multiple output embodiment of the invention in which a chip input 601, for example In6, may be connected to two operational amplifiers according to the invention, i.e. the operational amplifier associated with the 6th emitter of transistor 408 in FIG. 4 and the corresponding operational amplifier in channel "B", with each of the amplifiers having a separate output, i.e. the XOUTA output for channel "A" and the XOUTB output for channel "B". ICX chip 401 may be programmed to connect a single input to any one of the multiple outputs, XOUTA and XOUTB. Or, more generally, ICX chip 401 may be programmed to connect any one of its eighteen inputs 601 with one or both of its two outputs, XOUTA or XOUTB. Thus by combining several of the simple multiplexer circuits 400 and the selectable gain output circuits 500, ICX chip 401 provides a complex multiplexer 680 with selectable inputs, selectable outputs, and selectable gain and in which signals are passed with little distortion over a wide band width of frequencies.

Referring to FIGS. 1, 4, and 6 and analyzing the complex multiplexer 680 in another way, the basic multiplexing amplifier 100 includes two portions: a switching portion 121 and a feedback portion 114. As can be seen from FIGS. 4 and 6, a switching portion 421 is provided for each input 601 and for each output 502 and 632. That is, if I is number of inputs 601 and O is the number of outputs, 502 and 632, then the number of switching portions 421 is equal to I times O, or 36 in the embodiment of FIG. 6. There is a different switching portion 421 connected between each input and each output. This is fundamentally the reason why any one of the inputs can be connected to any one of the outputs, and the programming for this can be easily accomplished. On the other hand, feedback portion 455 is common to all the switching portions that connect to each output. This permits the feedback portion to be relatively sophisticated without unduly multiplying the complexity of the circuit. This design allows a high density of multiplexing switches while still providing high signal integrity and wide band width.

Figure 7:
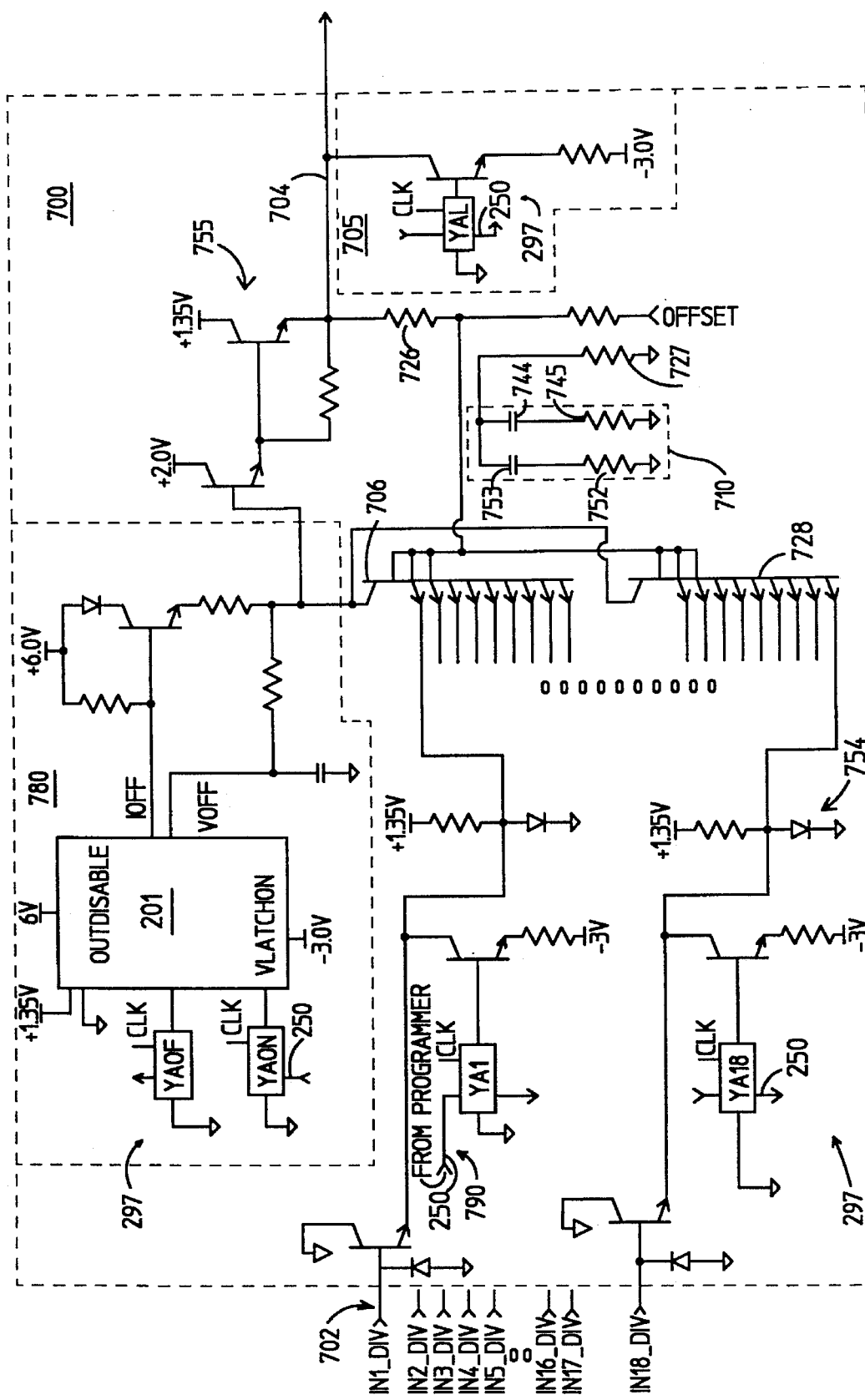
FIG. 7 is a circuit diagram of the multiplexer in which the outdisable circuit of FIG. 3 is combined with the simple multiplexer of FIG. 4.

FIG. 7 shows a multiplexer amplifier 700 as implemented in a type "Y" integrated circuit 802 (FIG. 8). Multiplexer amplifier 700 comprises a combination of circuits previously discussed. It includes an programmable OFF circuit 780 which is identical to the programmable OFF circuit 280 of FIG. 2, except that the latches YAON and YAOF are in a different shift register 297 and thus connect to a different data line 250. It includes an outdisable circuit 201 that is identical to the outdisable circuit in FIGS. 2 and 3. Multiplexer amplifier 700 also includes a biasing circuit 705 that is identical to biasing circuit 290 in FIG. 2, except that again the latch YAL is a part of shift register 297 and connects to a different data line 250. It also includes cable compensation circuit 710 which is identical to cable compensation circuit 587 in FIG. 5, except that the values of resistors 753 and 745 are 350 ohms and 1.5 Kohms, respectively, and the values of capacitors 752 and 744 are 1.4 picofarads and 6.7 picofarads, respectively. The rest of the circuit 700 is identical to the multiplexer 454 and output driver amplifier 455 in FIG. 4, minus the high frequency compensation elements 470 and 462 which are included in circuit 780, except that again the latches YA1 through YA18 are in shift register 297 and connect to data line 250, and the values of resistors 726 and 727 are 60 ohms and 180 ohms, respectively. The only other difference is that the inputs 702 come from an on-chip input divider circuit 862 (FIG. 8) which will be discussed below. The other details of the components of circuit 700 will not be discussed again since they were previously covered. By combining eighteen operational amplifiers according to the invention plus the programmable off circuit 780, muxamp 700 provides an eighteen channel 790 multiplexer that passes a selected one of the signals input on the eighteen inputs 70 to its output 704 with little distortion, over a wide band width of frequencies, and, when all channels of multiplexer 754 are off, provides a high impedance, no current state on output 704 that looks like an open circuit to external circuits.

FIG. 8 shows a block circuit diagram of the type "Y" integrated circuit 802 which shall also be referred to as an ICY circuit for short. ICY 802 has 54 inputs 860 which are each connected to a 1/20 input divider circuit, such as 862. Each input divider, such as 862, connects to each of two channels, which are again designated channel "A" and channel "B". Each of the "A" and "B" channels are identical and thus only the "A" channel will be discussed. The "A" channel comprises a 54:1 multiplexer 810 and a programmable output stage 200 as shown in FIG. 2. 54:1 multiplexer 810 comprises three 20:1 multiplexers 700, 820, and 822, each of which are identical to the multiplexer 700 shown in FIG. 7. Again, some components of muxamp 700 are shown in the "A" channel for ease of reference. Again, it should be noted that the nine emitter transistors 706 and 728 in FIG. 7 form part of both the multiplexer 754 and the output driver amplifier 755, though this is not possible to show in the notation of FIG. 8. In this case, output driver amplifier 755 includes programmable OFF circuit 780.

As indicated above, each ICY chip input 702, after the input divider, connects both to the "A" channel and the "B" channel. In each channel, the output 704 of the muxamp 700 is daisy-chained with the outputs of the other muxamps 820 and 822 to form the output 870 of 54:1 multiplexer 810, which becomes the input of programmable output stage 200. Thus ICY chip 802 is a multiple output embodiment of the invention in which a chip input 860 may be connected to two operational amplifiers according to the invention, with each of the amplifiers having a separate output, i.e., the YOUTA output for channel "A" and the YOUTB output for channel "B". ICY chip 802 may be programmed to connect a single input to any one of the multiple outputs. Or, more generally, ICY chip 802 may be programmed to connect any one of its 54 inputs 860 with one or both of its two outputs, YOUTA or YOUTB. Thus by combining several of the simple multiplexer circuits 700 and the programmable output stages 200, ICY chip 802 provides a complex multiplexer with selectable inputs and selectable outputs, in which signals are passed from any of inputs 860 to either of outputs YOUTA and YOUTB with little distortion over a wide band width of frequencies, and when no channel of one of multiplexers 810 or 810 is selected, provides a high impedance, no current state on the corresponding output YOUTA or YOUTB, respectively, that looks like an open circuit to external circuits.

It is a feature of the invention that a large number of muxamps 700 can be daisy-chained together to produce a chip with a large number of channels. Three are shown daisy-chained together in the ICY chip 802, but many more could also be combined in this way. For example, a one-hundred-and-twenty-six channel chip could be made by combining seven muxamps 700 per channel. This is possible because each muxamp 700 has a programmable OFF circuit 780 controlling the biases on its output driver circuit 755. Thus, the output 704, for example, will look like an open circuit when no channel of muxamp 700 is selected, and thus will not interfere with the signal from either muxamp 820 or 822 if one of the channels in these muxamps is selected. Likewise, a signal from a selected channel in muxamp 820 or 822 will not turn on the output driver amplifier 755 in muxamp 700.

Figure 9:
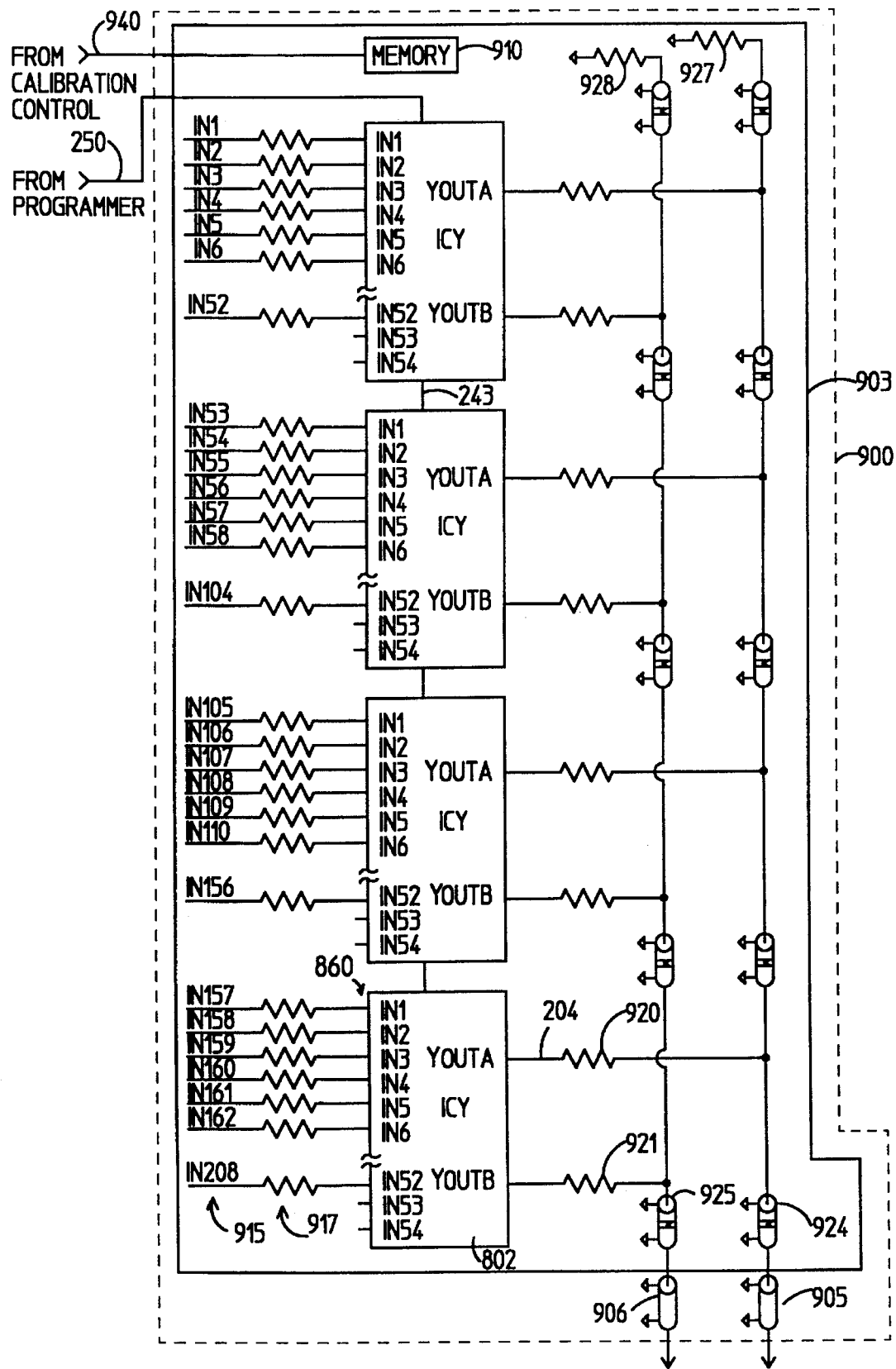
FIG. 9 is a block circuit diagram showing the application of five of the "Y" type integrated circuit chips of FIG. 8 to form a two-hundred-and-eight to two multiplexer.

FIG. 9 shows a semi-block circuit diagram of two-hundred-and-eight pin plastic quad flat pack (PQFP) probe 900, the principal components of which are four ICY chips 802. The connection of each chip 802 within the probe circuit 900 is identical, so only one will be discussed. Probe 900 includes probe head 903 and coaxial cables 905 and 906. Probe head 903 includes memory 910, the four ICY chips 802, two-hundred-and-eight probe inputs 915, two-hundred-and-eight input resistors 917, eight output resistors, such as 920 and 921, 50 ohm "co-ax" microstrips 924 and 925, and microstrip terminating resistors 927 and 928.

Memory 940 is connected to calibration control circuit 1022 (FIG. 1) through wire cable 940, preferably a serial interface connection. Integrated circuit chip 802 is connected to channel selection programmer 1021 via data cable 250, also preferably a serial interface connection. Each of chips 802 is serially connected to the next chip via the data line 250. This serial connection via data line 250 transfers data sequentially through the latches, such as YA1, in the ICY chips 802, and thus the latches effectively form a shift register 297 (FIG. 7). Each of probe inputs 915 connect to one of ICY chip 802 inputs 860 through a resistor 91 7. As discussed above, each of ICY chips 802 include an "A" channel output YOUTA and a "B" channel output YOUTB. Each of the "A" channel outputs connect to microstrip 924 through a resistor, such as 920, and each of the "B" channel outputs connect to microstrip 925 through a resistor 921. Microstrips 924 and 925 are connected to ground via terminating resistors 927 and 928, respectively, and to coaxial cables 905 and 906, respectively. Resistors 917 are preferably 150 ohm resistors imbedded in the printed circuit board of the probe head 903. Resistors 921, 922, 927 and 928, are preferably 50 ohms.

It is a feature of the invention that the outputs of chips 802 are simply daisy-chained along a microstrip. This is possible because each output YOUTA and YOUTB of each chip 802 is connected internally to a programmable output stage 200 (FIG. 2), which, when all channels in that chip are deactivated, holds the output in a high impedance, no current, state that looks like an open circuit. Thus the output will not interfere with a signal from any other output daisy-chained on the microstrip 905 or 906. Likewise, a signal placed on the microstrip by one of the outputs of the other ICY chips, an input of which is selected, will not turn on the output driver transistor 215 in the output stage 200. A large number of ICY chips, practically from one to about a dozen, can be daisy-chained to produce probe heads with sufficient inputs to handle any circuit package available. If the number of desired inputs is not divisible by 54, then some chip inputs are simply not connected. For example, in the probe head 903 shown, two-hundred-and-eight probe inputs are accommodated by not connecting the last two inputs on each chip. Thus by combining several of the ICY chips 802, the probe head 903 provides a complex multiplexer with selectable inputs and selectable outputs, in which signals are passed from any of inputs 915 to either of outputs 905 and 906, with little distortion over a wide band width of frequencies, and when no channel of probe head 903 is selected, provides a high impedance, no current, state on outputs 905 and 906 that looks like an open circuit to external circuits.

FIG. 10 shows a probe system 1000 that incorporates all of the circuits we have previously described. Probe system 1000 includes three PQFP probes 1002 901, and 1004, each of which include a probe head, such as 903, and two coaxial cables, such as 905 and 906. Each of probe heads 1005, 903 and 1006 has a specific number of inputs; probe head 1005 has 240 inputs 1007, probe head 903 has 208 inputs 915, and probe head 1008 has 160 inputs 1008. Each probe head 1005, 903, and 1006 is mechanically enclosed in a probe body (not shown), which probe body is designed to be easily held in one hand and easily mechanically coupled to a specific plastic quad flat pack (PQFP) (not shown). As discussed in reference to FIG. 9, probe head 903 comprises four ICY chips 802 with their "A" channel outputs connected to coaxial cable 905 and their "B" channel outputs connected to coaxial cable 906. Likewise each of the other probe heads 1005 and 1006 comprise an appropriate number of ICY chips 802 with their "A" channel outputs daisy-chained to the "A" channel probe head output OUTA and their "B" channel outputs daisy-chained to probe head output OUTB.

The exemplary probe system 1000 also includes a general purpose single point probe 1010, which includes nine probe tips 1012 and a circuit pod 1014. Each probe tip 1012 is connected to pod 1014 via one of 50 ohm coaxial cables 1015. General purpose probe 1010 may be used to probe circuits for which no specific probe head is available. Pod 1014 essentially comprises a ICX chip 401, with appropriate 50 ohm resistors connected to its inputs and outputs, and with its "A" channel output XOUTA, its "B" channel output XOUTB, is trigger output stage "A" output TRIGA, and its trigger output stage "B" output TRIGB connected to pod outputs 1016, 1017, 1018, and 1019, respectively. The trigger outputs are not used in this application, but the outputs 1016 and 1017 are connected to coaxial cables 1080 and 1081, respectively.

Probe system 1000 also includes a printed circuit board (PCB) 1020 which fits into a logic analyzer 1033 designed to interface with the probe, which logic analyzer is sometimes referred to in the art as a "main frame". PCB 1020 contains a channel selection programmer circuit 1021, a calibration control circuit 1022, an offset control circuit 1023, and a probe power circuit 1024, which circuits share a microprocessor 1025 and its associated memory 1026; e.g., the channel selection programmer 1021 includes memory 1026 and microprocessor 1025 in that channel selection software stored in memory 1026 is used by microprocessor 1025 to provide output signals that cause the programmer 1021 to output data on data lines 250 and 450, which are part of cable 1060. Channel selection programmer 1021 preferably includes a field programmable gate array which is programmed to interact with microprocessor 1025 and memory 1026 to output a series of bits to shift registers 297 and 497 comprising latches shown in FIGS. 1, 2, 4, 5, and 7. As discussed above, this data shifts through the latches in the chips ICX 802 and ICY 401 to program them to connect the selected inputs with the selected outputs, to activate the selected gain amplifiers, and to turn on and off the programmable OFF circuits in output stages 200. Microprocessor 1025 and memory 1026 are not on PCB 1020 but are in main frame 1033, and thus are shown with a dotted line around them. The various circuits. 1021 through 1026 on PCB 1020 include other electrical elements and interconnections that, to those skilled in the art, will be clear from the above and following description.

PCB 1020 also includes a second level multiplexer 1027. Multiplexer 1027 is essentially a ICX chip 401 with appropriate 50 ohm resistors connected to its inputs and outputs. Each of the coaxial cables, such as 905, 906, 1080, and 1081, from the probes 1002, 901, 1004, and 1 010 are connected to one of the eight inputs 1055 of second level multiplexer 1027, which correspond to the first eight inputs of ICX chip 401. The XOUTA and XOUTB outputs of chip 401 are connected to the probe system outputs 1029 and 1030, respectively. Thus second level multiplexer 1027 may be programmed via line 450, which is part of cable 1060, to connect any of its eight inputs to either or both of the probe outputs, 1029 and 1030.

In addition, probe system 1000 includes means 1040 for inputting control signals, such as for programming second level multiplexer 1027, probe heads 1005, 903, and 1006, and general purpose probe 1010. In the preferred embodiment, means 1040 includes dials 1041 and a keyboard 1042, though almost any mechanism for generating electrical control signals may be used. In the preferred embodiment, the dials 1041 are located on the front of the logic analyzer 1033, and the keyboard is a computer work station keyboard; however, for simplicity, they are shown on a common control signal input means 1040. In the preferred embodiment, several dials 1045 together with channel selection programmer 1021 comprise selection means 1043 for selecting one of the probe inputs 1007, 915, 1008, 1012 and one of the probe outputs 1029 or 1030, while one dial 1046 together with channel selection programmer 1021 comprise gain selection means 1044 for selecting one of a plurality of possible gains for signals passing from selected input to the selected output.

The outputs 1029, 1030 of second level multiplexer 1027 are connectable to a test instrument, such as an oscilloscope 1050, via 50 ohm microstrip "coax's" 1049. Control PCB 1020 is connected to probe heads 1005, 903, 1006, general purpose probe 1010, and second level multiplexer 127 via a multiwire cable 1060. Multiwire cable 1060 includes conventional power lines, a serial interface including data lines 250 and 450, clock lines, coaxial cables 905, 906, 1080, 1081 etc., and other lines.

The labels, such as YPAON, YPAON, and YPAL, that have been applied to the latches in the above discussion indicate their relative position in the circuits, and in particular the shift registers 297 and 497 that are part of the ICY and ICX chips 802 and 401, respectively. The first one or two letters before the "A" or "B" indicate the integrated circuit in which the latch is located: if the first letter is an "X", the latch 10 is in the ICX chip (FIG. 6), and if the first letter is a "Y" the latch is in the ICY chip (FIG. 8). If there is no other letter before the "A" or "B", the latch is in a muxamp (FIGS. 4 and 6); if there is a "G" before the "A" or "B", it is in a selectable gain output circuit (FIG. 5), and if there is a "P" it means the latch is in a programmable output circuit (FIG. 2). The letter "A" or "B" indicates whether the latch is in the "A" channel or "B" channel; if the last symbol is a numeral, it indicates which one the latch is of a series of latches having a similar function in the circuit location given by the first letters, e.g. XA2 indicates the second latch in the ICX muxamp in the "A" channel; if the last symbol is a letter or letters, this indicates a specific latch having a specific function, such as "ON" (output disable on) or "OF" (output disable off), or "L" (for bias level control), e.g. latch YAL indicates the biasing control latch in the "A" channel muxamp of the ICY chip.

The probe 1000 is programmed as follows. Assuming that probe head 903 is being programmed, the input or inputs 915 to be connected to output 1029 and output 1030 are selected by turning dials 1045 or by inputting the information with keyboard 1042. Input means 1040 responds by providing electrical signals to channel selection programmer 1021, which utilizes microprocessor 1025 and memory 1026 to output serial data on cable 1060 to shift a series of data bits through all the latches, such as YA1, YA2 through YAL in muxamp 700 (FIG. 7) and YPAON, YPAOF, and YPAL in programmable output circuit 200 (FIG. 2), in probe head 915. As indicated above the latches, as a whole, form a shift register 297, and, like conventional shift registers, the data shifts from one latch to the next with each clock pulse. The data goes from the first ICY chip to the last in each probe head, and within each ICY chip it goes through latches 1 through 18 in the first "A" channel muxamp 700 (FIG. 8), then to the three outdisable latches YAON, YAOF, and YAL in the first "A" muxamp 700, then to the three outdisable latches YAON, YAOF, and YAL in the in the first "B" channel muxamp 823, then to latches 1–18 in the "B" channel muxamp 823, then to latches 1–18 in the 2nd "A" channel muxamp 820, then to the three outdisable latches in muxamp 820, the three outdisable latches in the 2nd "B" channel muxamp 824, latches 1–18 in the muxamp 824, then to latches 1–18 in the third "A" channel muxamp 822, the outdisable latches in muxamp 822, the outdisable latches in the third "B" channel muxamp 825, latches 1–18 in the muxamp 825, then to latches YPAON, YPAOF and YPAL in the "B" channel programmable output stage 827, then to the latches YPAON, YPAOF, and YPAL in the "A" channel programmable output stage 200, and finally to the latch that activates the temperature sensing buffer (not shown) in the chip.

Assume for example, it is selected that input In7 in probe head 1005 is to be connected to the "A" output of probe head 1005 and input In239 in probe head 1005 is to be connected to the "B" output. Since there are 240 inputs in probe head 1005, then there will be five ICY chips, but only the first twenty-four of the fifty-four inputs in the fifth ICY chip will be used. Then programmer 1021 shifts data through the latches until the latch associated with the eighth input of the first multiplexer amplifier 700 (FIG. 8) in the "A" channel of the first ICY chip in the probe head and the latch associated with the 5th input in the 2nd muxamp 824 in the "B" channel (FIG. 8) in the fifth ICY chip hold a logic "1" and all the other input latches YA1, YA2, etc. in the probe head hold a logic "0". In addition, the latch YAON in the first "A" channel muxamp 700 in the first ICY chip and the latch YAON in the second "B" channel muxamp 824 in the fifth ICY chip in the probe head 1005 will hold a logic "1", the other latches YAON in all the other muxamps in the probe head 1005 will hold a logic "0", the latches YAOF and YAL in the first muxamp 700 in the "A" channel in the first ICY chip and the same latches in the 2nd muxamp 824 in the "B" channel in the fifth ICY chip will hold a logic "0", and the other latches YAOF and YAL in all the other muxamps in all the other ICY chips in the probe head will hold a logic "1". Further, in the output stage circuit 200 (FIG. 8) in the "A" channel of the first ICY chip in the probe head and in the programmable output stage 827 in the "B" channel of the fifth ICY chip, the latch YPAON (FIG. 2) will hold a logic "1" and the laches YPAOF and YPAL will hold a logic "0", and in all the other programmable output stages of the five ICY chips the latch YPAON will hold a logic "0" and the latches YPAOF and YPAL will hold a logic "1".

If no input in probe head 1005 is selected, then the data is shifted through the shift register until all latches YA1, YA2, etc. hold a logic "0", latches YAON and YPAON hold a logic "0", and latches YAOF, YAL, YPAOF, and YPAL hold a logic "1". This places the outputs OUTA and OUTB of probe head 1002 in high impedance, no current state that looks like an open circuit.

Each probe head 1005, 903 and 1006, and general purpose probe 1010 has its own shift register; thus each probe head and pod may be programmed independently of the other probe heads. For each probe head and pod, the selection of which of the inputs is to be connected to which of the outputs is made with input means 1040 and the channel selection programmer 1021 outputs a string of bits to the shift register 497 if it is a pod including an ICX chip or 297 if it is a probe head using ICY chips, which string of bits activates or deactivates the latches as appropriate to connect the selected input or inputs with the selected output or outputs and to leave the outputs, such as 704, of the muxamps, such as 700, the outputs, such as 502, of the ICY chips, such as 401, and the outputs, such as 905, 906, of the probe heads, such as 903, for which no inputs have been selected, in a high impedance, no current state which appears to an external circuit as an open circuit.

In the case of the general purpose probe 1010, the gain may be selected also. When programming an ICX chip 401, such as that in pod 1014, the order of the latches in the shift register 497 is: latches 1–18 in the "A" channel muxamp 400, i.e. the latches XA1 through XA18 in FIG. 4, then latches 1–18 in the "B" channel muxamp 620, then the three latches in the "B" channel selectable gain output stage 622, then the latches XGA1, XGA2, and XGA3 (FIG. 5) in the "A" channel selectable gain output stage 500, then the temperature buffer latch (not shown).

After programming all the probe heads 1005, 903, 1006 and the general purpose probe 1010, or at least those that need to be reprogrammed, the second level multiplexer 1027 may be programmed. Again the input or inputs to be connected are selected and the output or outputs to which each selected input is to be connected are also selected. In this case, one of the three available gains, which in the preferred embodiment are 1.1, 2.2, or 2.2 with cable, are also selected using gain selection means 1046. Programmer 1021 again outputs a string of bytes to the ICX chip 401 in the second level multiplexer 1027, with the string passing through the latches of the shift register 497 in the order given above for the ICX chip in the pod 1014. The bytes in the latches activate or deactivate the latches to electrically connect the selected input or inputs to the selected output or outputs, with the gain selected for each output.

At this point the probe 1000 has electrically connected either: one of the inputs 1007, 915, 1008 (FIG. 10), or probe tips 1012 to one of the outputs 1029 or 1030, one of the inputs 1007, 915, 1008 or probe tips 1012 to both outputs 1029 and 1030, or one of the inputs 1007, 915, 1008 or probe tips 108 to one output 1029 or 1030 and another of the inputs 1007, 915, 1008 or probe tips 1012 to the other output. Nothing more needs to be done to pass a signal from the selected input(s) to the selected output(s) with the selected gain over a wide band width and with high signal integrity.

Figure 11:
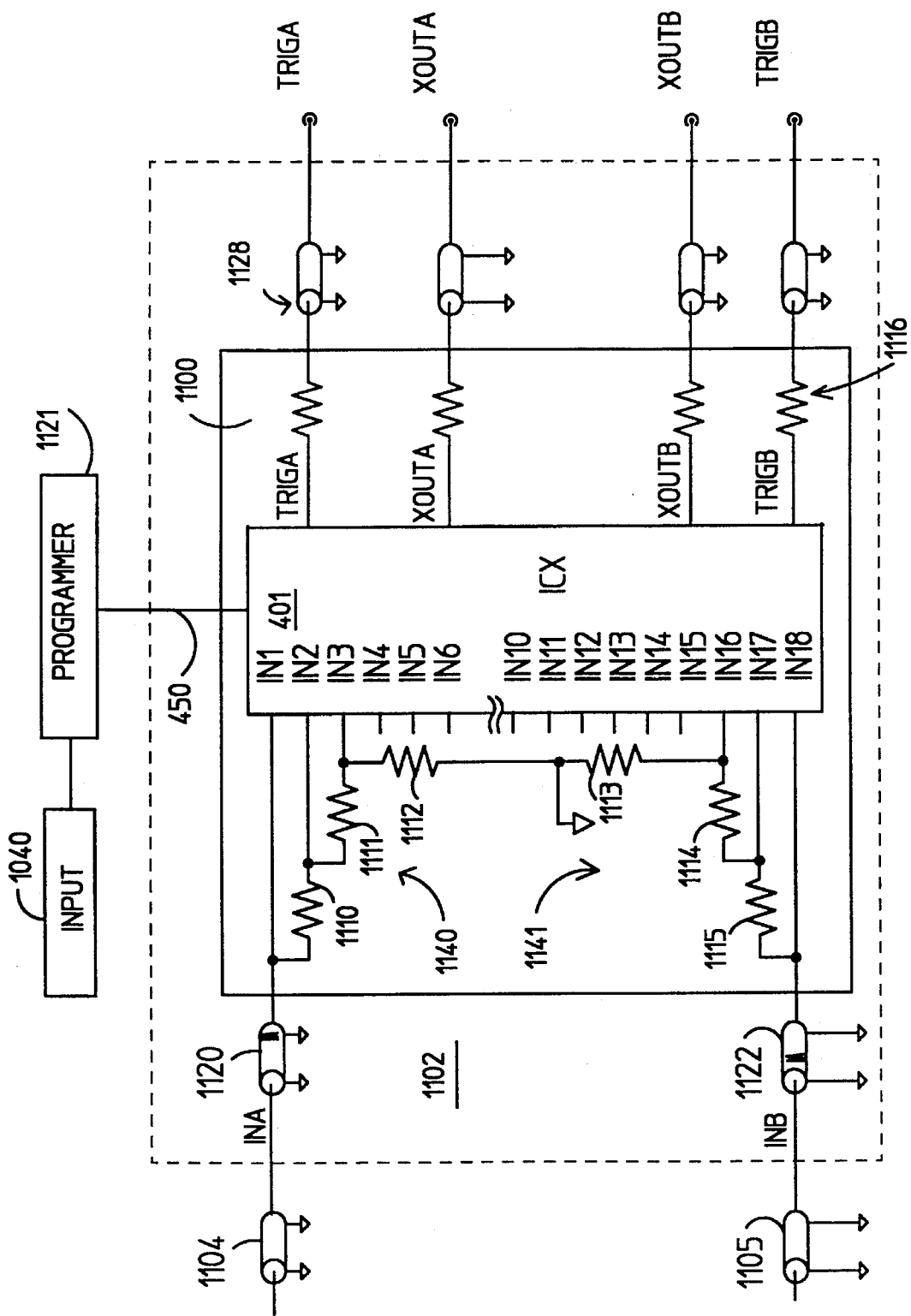
FIG. 11 is a circuit diagram of a selectable attenuation application of the amplifier according to the invention.

FIG. 11 shows an embodiment of the programmable amplifier according to the invention in combination with a voltage divider to provide a selectable attenuation circuit 1100. This application of the programmable amplifier is preferably in an oscilloscope preamp 1102. Signals are applied to the "A" channel input InA and "B" channel input InB of the oscilloscope preamp 1102 via coaxial cables 1104 and 1105, which can be coaxial cables such as 1049 from probe system 1000 (FIG. 10). Oscilloscope preamp 1102 comprises ICX chip 401, resistors 1110 through 1115, four resistors 1116, "co-ax" microstrips 1120 and 1122, and four coaxial cables 1128. Circuit 1100 is on a chip carrier.

Input InA connects to microstrip 1120, which connects to the In1 input of ICX chip 401. Resistor 1110 is connected between input In1 and input In2, resistor 1111 is connected between input In2 and In3, and resistor 1112 is connected between input In3 and ground. Likewise microstrip 1122 connects preamp input InB with the In18 input of ICX chip 401, resistor 1115 is connected between input In18 and input In17, resistor 1114 is connected between input In17 and In16, and resistor 1113 is connected between input In16 and ground. The outputs TRIGA, XOUTA, XOUTB, and TRIGB of ICX 401 are connected to coaxial cables 1128, which form the outputs of oscilloscope preamp 1102. As before, ICX chip 401 is connected to programmer 1121 via data line 450, and programmer 1121 is connected to input means 1040.

As we have seen several times now, ICX chip 401 can connect any one of its inputs to one or all of its outputs. Resistors 1110 through 1112 form an "A" channel voltage divider 1140 and resistors 1113 through 1115 form a "B" channel voltage divider. Depending on which of inputs In1, In2, In3, In16, In 17, or In 18 are selected to be connected to the outputs, and which outputs are selected, the signal input on the input InA or InB will be passed to the selected output with a different attenuation. For proper termination of coaxial cables 1104, 1105 and microstrips 1120, 1122, the total of the resistances in each attenuator 1140 and 1141 should be 50 ohms. Preferably resistors 1110 through 1115 have the values 25 ohms, 15 ohms, 10 ohms, 10 ohms, 15 ohms and 25 ohms, respectively. This results in an attenuation of +1 if inputs In1 or In18 are selected, +2 if inputs In2 or In17 are selected, and +5 if inputs In3 or In 16 are selected. Resistors 1116 each have a value of 50 ohms. Thus, the combination of voltage divider circuits 1140 and 1141 with multiplexer amplifiers according to the invention in ICX 401, results in a selectable attenuation circuit 1100 that, for a wide band width of frequencies, passes signals input on cables 1104 or 1105, or both to one, some, or all of outputs 1128 with little distortion and the selected attenuation.

There has been described a novel programmable operational amplifier with feedback which provides programmable channel selection with high signal integrity and band width, and which has many other advantages. It is evident that, now that the invention has been fully disclosed, those skilled in the art may now make numerous uses and modifications of the specific embodiment described, without departing from the inventive concepts. For example, now that it is seen that several variations of the amplifier result in unique properties, other variations may be devised. Further, now that it is seen that a programmable operation amplifier can be designed which combines high signal integrity, high band width, and a programmable positive OFF state, and provides programmable multiplexers, programmable gain, and programmable attenuation, many other applications of the amplifier can be devised. Or equivalent components or circuits can be substituted for the various components and circuits described. Additional features may be added. A greater or lesser number of parts may be used. Consequently, the invention is to be construed as embracing each and every novel feature and novel combination of features present in and/or possessed by the op-amp described.

What is claimed is:

1. An amplifier comprising:

an amplifier input and an amplifier output;

a first amplifier channel including a first input transistor emitter and a first output transistor emitter, said first input transistor emitter and said first output transistor emitter connected together to form a first emitter pair;

a second amplifier channel including a second input transistor emitter and a second output transistor emitter, said second input transistor emitter and said second output transistor emitter connected together to form a second emitter pair;

selection means for selecting one of said first and second amplifier channels;

activation means responsive to said selection means for activating said selected amplifier channel so that a signal applied to said input passes from said amplifier input, through said selected amplifier channel, to said amplifier output; and emitter voltage control means for forcing said first emitter pair to a controlled shut off voltage when said first amplifier channel is not activated and for forcing said second emitter pair to a controlled shut off voltage when said second amplifier channel is not selected.

2. An amplifier as in claim 1 wherein said activation means comprises a current source and a switch means responsive to said selection means for connecting said current source to said selected emitter pair, said switch means comprising a transistor and a latch.

3. An amplifier as in claim 1 and further including a power supply and a ground, wherein said output comprises a first amplifier output and a second amplifier output, said first amplifier output is connected to said first amplifier channel and said second amplifier output is connected to said second amplifier channel whereby said input is connected to said first amplifier output when said first amplifier channel is selected and to said second amplifier output when said second amplifier channel is selected, and wherein each of said amplifier channels is separately connected to said power supply and is separately connected to said ground.

4. An amplifier as in claim 1 wherein said first amplifier channel includes a first emitter/base junction, said second amplifier channel includes a second emitter/base junction, and said amplifier further includes first biasing means connected to said first emitter pair for ensuing that said first emitter/base junction is held off when said first channel is not selected, and second biasing means connected to said second emitter pair for ensuring that said second emitter/base junction is held off when said second channel is not selected.

5. An amplifier as in claim 4 wherein each of said first and second biasing means includes a power source and a resistor connected between the respective emitter pair and said power source.

6. An amplifier as in claim 1 and further including emitter voltage control means for forcing said first emitter pair to a controlled shut off voltage when said first amplifier channel is not activated and for forcing said second emitter pair to a controlled shut off voltage when said second amplifier channel is not selected.

7. An amplifier as in claim 1 and including a multi-emitter transistor, and said first and second output transistor emitters are two emitters of said multi-emitter transistor.

8. An amplifier as in claim 7 and further including a feedback loop from the collector to the base of said multi-emitter transistor.

9. An amplifier as in claim 1 and further including a power supply, first biasing means for connecting said first amplifier channel to said power supply, and second biasing means, separate from said first biasing means, for connecting said second amplifier channel to said power supply.

10. An amplifier as in claim 1 wherein said amplifier input includes a first input connected to said first amplifier channel and a second input connected to said second amplifier channel and said selection means comprises means for selecting one of said inputs, whereby said multiplexing amplifier electrically connects the selected one of said first and second inputs to said output.

11. An amplifier as in claim 10 wherein said amplifier includes a power supply, a first biasing means, a second biasing means, a first input transistor, and a second input transistor, said first input transistor emitter comprises the emitter of said first input transistor and said second input transistor emitter comprises the emitter of said second input transistor, said first input is connected to the base of said first input transistor, said second input is connected to the base of said second input transistor, the collector of said first input transistor is connected to said power supply through said first biasing means and the collector of said second input transistor is connected to said power supply through said second biasing means.

12. An amplifier as in claim 1 wherein said first amplifier channel further comprises a first gain means having a first gain, said second amplifier channel further comprises a second gain means having a second gain, said selection means comprises gain selection means for selecting a first gain or a second gain, and said activation means comprises means for activating the one of said channels having said selected gain.

13. An amplifier as in claim 1 wherein said first amplifier channel further comprises a first attenuator means having a first attenuation, said second amplifier channel further comprises a second attenuation means having a second attenuation, said selection means comprises attenuation selection means for selecting a first attenuation or a second attenuation, and said activation means comprises means for activating the one of said channels having said selected attenuation.

14. An amplifier as in claim 1 wherein said amplifier output includes a first output connected to said first amplifier channel and a second output connected to said second amplifier channel and said selection means comprises means for selecting one of said outputs, whereby said multiplexing amplifier electrically connects the selected one of said first and second outputs to said input.

* * * * *